US006630852B2

(12) United States Patent
Fujisawa et al.

(10) Patent No.: US 6,630,852 B2
(45) **Date of Patent: *Oct. 7, 2003**

(54) POWER-GENERATION DETECTION CIRCUIT FOR USE IN AN ELECTRONIC DEVICE AND POWER-GENERATION DETECTION METHOD AND POWER CONSUMPTION CONTROL METHOD FOR USE IN CONNECTION THEREWITH

(75) Inventors: Teruhiko Fujisawa, Shiojiri (JP); Shinji Nakamiya, Matsumoto (JP); Yoshitaka Iijima, Shiojiri (JP); Kenji Iida, Shiojiri (JP)

(73) Assignee: Seiko Epson Corporation, Nagano-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/972,591

(22) Filed: Oct. 5, 2001

(65) Prior Publication Data

US 2002/0079954 A1 Jun. 27, 2002

Related U.S. Application Data

(63) Continuation-in-part of application No. 09/694,223, filed on Oct. 23, 2000, which is a continuation of application No. 09/097,953, filed on Jun. 16, 1998, now Pat. No. 6,140,863.

(30) Foreign Application Priority Data

Jun. 17, 1997 (JP) ............................................ 9-160147
Mar. 10, 1998 (JP) ............................................ 10-58694

(51) Int. Cl.[7] ................................................ H03K 3/02
(52) U.S. Cl. ......................... 327/198; 368/66; 368/204
(58) Field of Search .......................... 327/18, 20, 143, 327/198; 323/242–244, 274, 284, 288; 368/66, 204

(56) References Cited

U.S. PATENT DOCUMENTS

| | | | | | |
|---|---|---|---|---|---|
| 4,956,826 | A | * | 9/1990 | Coyman et al. | 368/28 |
| 5,120,988 | A | * | 6/1992 | Matsuki | 327/144 |
| 5,550,516 | A | * | 8/1996 | Burns et al. | 331/116 M |
| 6,043,749 | A | * | 3/2000 | Saito et al. | 340/657 |
| 6,311,145 | B1 | * | 10/2001 | Hershenson et al. | 703/2 |

* cited by examiner

*Primary Examiner*—Terry D. Cunningham
*Assistant Examiner*—Quan Tra
(74) *Attorney, Agent, or Firm*—Stroock & Stroock & Lavan LLP

(57) ABSTRACT

A power-generation detection circuit for detecting a power-generation state by an AC voltage supplied from a power-generation device including a capacitor, and switching element, a resistor, and an inverter circuit which controls the charging of the capacitor by a power-generation device. The switching element is switched by the AC voltage from the power-generation device. The voltage of the capacitor is detected by the inverter circuit thereby performing power-generation detection.

2 Claims, 21 Drawing Sheets

POWER-GENERATION DETECTION CIRCUIT FOR USE IN AN ELECTRONIC DEVICE AND POWER-GENERATION DETECTION METHOD AND POWER CONSUMPTION CONTROL METHOD FOR USE IN CONNECTION THEREWITH

CROSS REFERENCE TO RELATED APPLICATIONS

This application is a Continuation-In-Part of application Ser. No. 09/694,223, filed Oct. 23, 2000, now pending, which is a Continuation of application Ser. No. 09/097,953, filed Jun. 16, 1998, now issued as U.S. Pat. No. 6,140,863.

BACKGROUND OF INVENTION

The present invention relates to a power-generation detection circuit and, in particular, to power-generation detection for use in an electronic device which is driven by an AC power generated by motion of a rotating weight or motion of a spring. The invention further relates to a semiconductor device in which the power-generation detection circuit is formed. And more in particular an electronic device, having the power-generation detection circuit, which is a timepiece and a power-generation detection method and a power consumption control method for operating the electronic device.

In a compact portable electronic device, such as a wrist watch, it is known to incorporate a power-generation device therein to obtain power for driving the electronic device without a battery. Referring now to FIG. 15, there is shown a simplified configuration of an electronic device which incorporates a power-generation device 6. This portable electronic device includes an electromagnetic power-generation device as the power-generation device 6. Power-generation device 6 includes a rotating weight 7 that moves in a swinging motion when the electronic device is moved or shaken, a train wheel mechanism 8 for transmitting the rotating motion of rotating weight 7, a stator 9 and a rotor 10. When rotor 10 rotates, an electromotive force is generated by an output coil 11 of stator 9, so that an AC power is output In addition, the AC power output from electromagnetic generator 6 is full-wave rectified by a rectification diode bridge 12 to supply the power to a large-capacity capacitor 13 and a circuit unit 14 of the electronic device. When no power generation is performed by electromagnetic generator 6, circuit unit 14 is driven by power stored in large-capacity capacitor 13. For this reason, the portable electronic device can continuously operate circuit unit 14 without a battery.

Because the electronic device described above has no means for detecting the state of power generation supplied from power-generation device 6, the current consumption of circuit unit 14 is constant regardless of the state of power generation of power-generation device 6. As a result, power is consumed by circuit unit 14 even while no power is being generated by power-generation device 6. This may result in large-capacity capacitor 13 being discharged within a short period of time with the possibility of circuit unit 14 stopping completely.

SUMMARY OF THE INVENTION

The present invention is for a power-generation detection circuit for detecting the state of power generation in an electronic device. In accordance with the present invention, a power-generation detection circuit is provided which includes a switching element for performing a switching operation in response to the cycle of an externally generated AC power signal. A capacitor element is coupled to the switch for storing charges depending on the state of the switch, the capacitor element having a discharge path. A discharging element is inserted in the discharging path of the capacitor element for discharging the charges stored in the capacitor element. A voltage detector is coupled to the capacitor element for detecting whether voltage of the capacitor element exceeds a predetermined value.

In an exemplary embodiment, the discharging element of the power-generation detection circuit of the present invention is a resistor element.

In an exemplary embodiment, the discharging element of the power-generation detection circuit of the present invention is a constant-current circuit. The constant-current circuit of the power-generation detection circuit of the present invention includes a constant-current source and a current mirror circuit.

In an exemplary embodiment, the power-generation detection circuit of the present invention includes a current-limiter connected in series with the capacitor element for limiting the charge current of the capacitor element.

In an exemplary embodiment, the voltage detector of the power-generation detection circuit of the present invention is an inverter circuit.

In an exemplary embodiment, the voltage detector of the power-generation detection circuit of the present invention is a Schmidt trigger inverter circuit.

In an exemplary embodiment, the voltage detector of the power-generation detection circuit of the present invention is a comparator circuit.

In an exemplary embodiment, the switching element of the power-generation detection circuit of the present invention is a transistor. The transistor may be a MOS transistor or a bipolar transistor.

In accordance with the present invention, a semiconductor device is provided which includes a switching element for performing a switching operation in response to the cycle of an externally generated AC power signal. A capacitor element is coupled to the switch for storing charges depending on the state of the switch, the capacitor element having a discharge path. A discharging element is inserted in the discharging path of the capacitor element for discharging the charges stored in the capacitor element. A voltage detector is coupled to the capacitor element for detecting whether a voltage of the capacitor element exceeds a predetermined value.

In an exemplary embodiment, the discharging element of the semiconductor device of the present invention is a constant-current source and a current mirror circuit. The current mirror circuit of the semiconductor device of the present invention is a pair of transistors.

In an exemplary embodiment, the switching element of the semiconductor device of the present invention is a transistor. The transistor may be a MOS transistor or a bipolar transistor.

In accordance with the present invention, an electronic device is provided which includes a power-generation device for generating AC power. A power-generation detection circuit, coupled to the power generation device, includes a switching element for performing a switching operation in response to the cycle of AC power generated by the power-generation device; a capacitor element is coupled to the switch for storing charges depending on the switching operation performed by the switching element, the capacitor element having a discharge path; a discharging element is inserted in the discharging path of the capacitor element for discharging the charges stored in the capacitor element, and a voltage detector is coupled to the capacitor element for detecting whether a voltage of the capacitor element exceeds a predetermined value.

In an exemplary embodiment, the power-generation device of the electronic device has a rotating weight for performing swinging motion and a power-generation element for generating electromotive force from the rotating motion of the rotating weight.

In an exemplary embodiment, the power-generation device includes an elastic member on which deformation forces act. A rotating member rotates as a result of a recovery force generated by the elastic member returning to its original shape. A power-generation element generates electromotive force from the rotating motion of the rotating member.

In an exemplary embodiment, the power-generation includes a piezoelectric element which generates electromotive force by a piezoelectric effect when displacement acts on the piezoelectric element.

In accordance with the present invention, an electronic device is provided which includes a power-generation device for generating AC power. A power-generation detection circuit, coupled to the power generation device, includes a switching element for performing a switching operation in response to the cycle of the AC power generated by the power-generation device; a capacitor element, coupled to the switch, stores charges in response to the switching operation performed by the switching element. A discharging element, inserted in the discharging path of the capacitor element, discharges the charges stored in the capacitor element; a voltage detector, coupled to the capacitor element, detects whether a voltage across the capacitor element exceeds a predetermined value; and a control circuit is coupled to the voltage detector for controlling power consumption of the device in response to the detection of the voltage detector.

In an exemplary embodiment, the control circuit of the electronic device of the present invention determines that the power-generation device is not performing power generation when a voltage across the capacitor element is not more than the predetermined value, and, as a result, reduces power consumption of the device. The control circuit of the electronic device of the present invention determines that the power-generation device is performing power generation when a voltage across the capacitor element exceeds the predetermined value, and, as a result, cancels the reduction in power consumption.

In an exemplary embodiment, the control circuit of the electronic device of the present invention controls the power consumption of the device based on the length of time in which a voltage across the capacitor element exceeds the predetermined value.

In accordance with the present invention, a timepiece includes a power-generation device for generating AC power. A power-generation detection circuit, coupled to the power-generation device includes a switching element, coupled to the power-generation device, for performing a switching operation in response to a cycle of AC power generated by the power-generation device; a capacitor element, coupled to the switching element, stores charges in response to the switching operation performed by the switching element; a discharging element is inserted in a discharging path of the capacitor element for discharging the charges stored in the capacitor element; and a voltage detector is coupled to the discharge element for detecting that a voltage across the capacitor element exceeds a predetermined value; and a timer circuit for counting time.

In an exemplary embodiment of the timepiece of the present invention, the power-generation detection device, power-generation circuit, and timer circuit are included in a housing of a wrist watch.

In an exemplary embodiment of the timepiece of the present invention, the power-generation device, power-generation detection circuit, and timer circuit are included in a housing of a pocket watch.

In an exemplary embodiment of the timepiece of the present invention, the power-generation device, power-generation detection circuit, and timer circuit are included in a housing of a table timepiece.

In accordance with the present invention, a power-generation detection method is provided that includes the steps of charging a capacitor element by a switching operation in response to a cycle of AC power which is externally generated; discharging the capacitor element when charging of the capacitor element is not performed; determining whether the voltage across the capacitor element is a predetermined voltage; and determining that power generation is being performed when the voltage across the capacitor element exceeds the predetermined voltage.

In accordance with the present invention, a power consumption control method is provided that includes the steps of charging a capacitor element by a switching operation in response to a cycle of AC power 8 which is externally generated; discharging the capacitor element when charging of the capacitor element is not performed, determining whether the voltage of the capacitor element is a predetermined voltage; determining that no power generation is performed when the voltage across the capacitor element does not exceed the predetermined voltage; and reducing power consumption of a circuit unit when no power generation is performed.

In an exemplary embodiment, a power consumption control method of the present invention also includes the steps of determining whether the voltage exceeds the predetermined voltage for a predetermined period of time, and canceling a reduction in power consumption of the circuit unit when the voltage exceeds the predetermined voltage for the predetermined period of time.

Accordingly, it is an object of the present invention to provide a power-generation detection circuit which can detect the state of generation power (i.e., the presence/absence of power generation and the strength of power generation) supplied from a power-generation device of an electronic device by a simple method so that power consumption of a circuit unit can be controlled depending on the detected state of power generation.

Still other objects and advantages of the invention will in part be obvious and will in part be apparent from the specification.

The invention accordingly comprises the features of construction, combinations of elements, and arrangement of parts which will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Embodiments of a power-generation detection circuit constructed according to the present invention will be described below with reference to the accompanying drawings.

Figure 1:
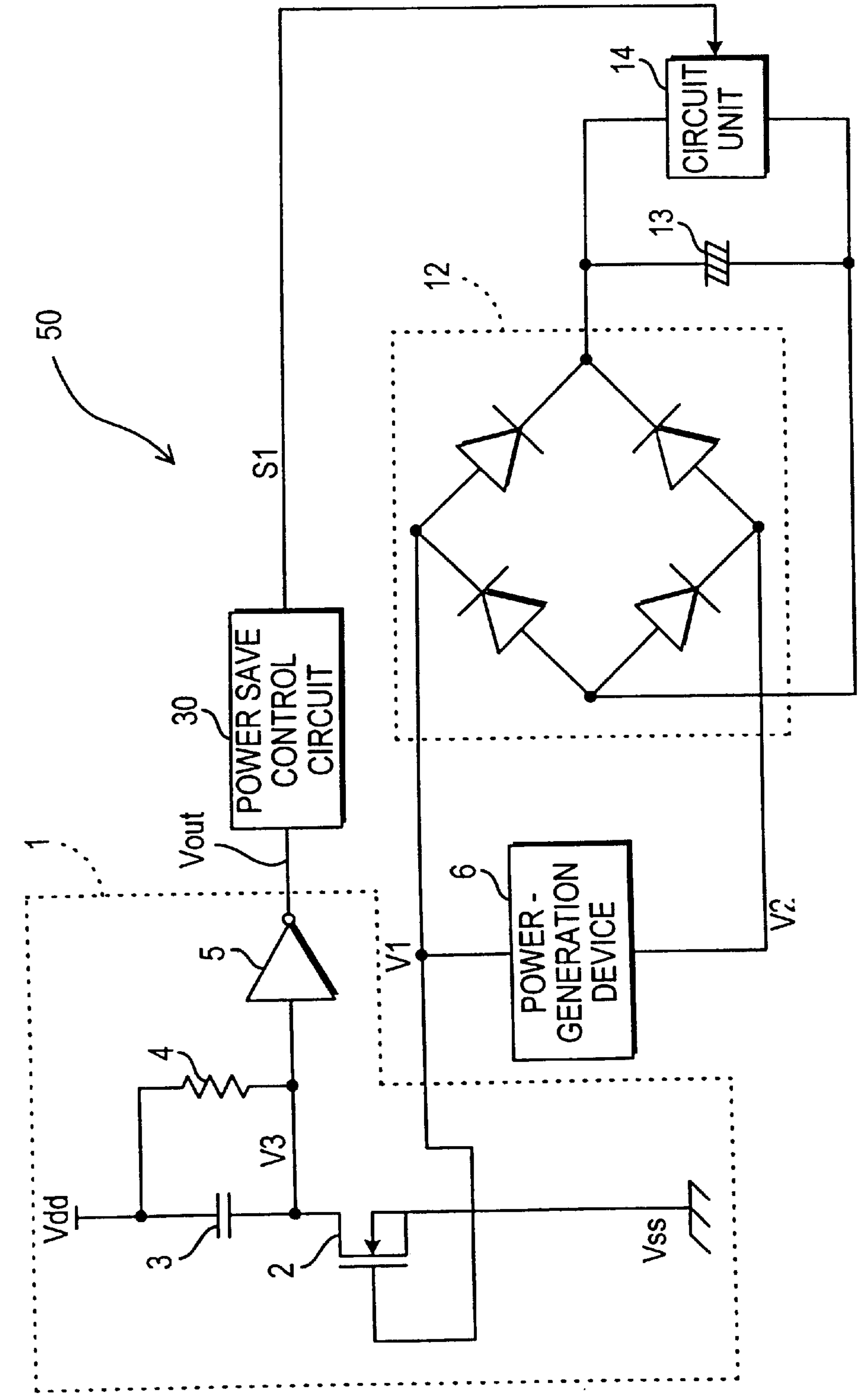
FIG. 1 is a circuit block diagram of an electronic device including a power-generation circuit constructed in accordance with the present invention.
Figure 2:
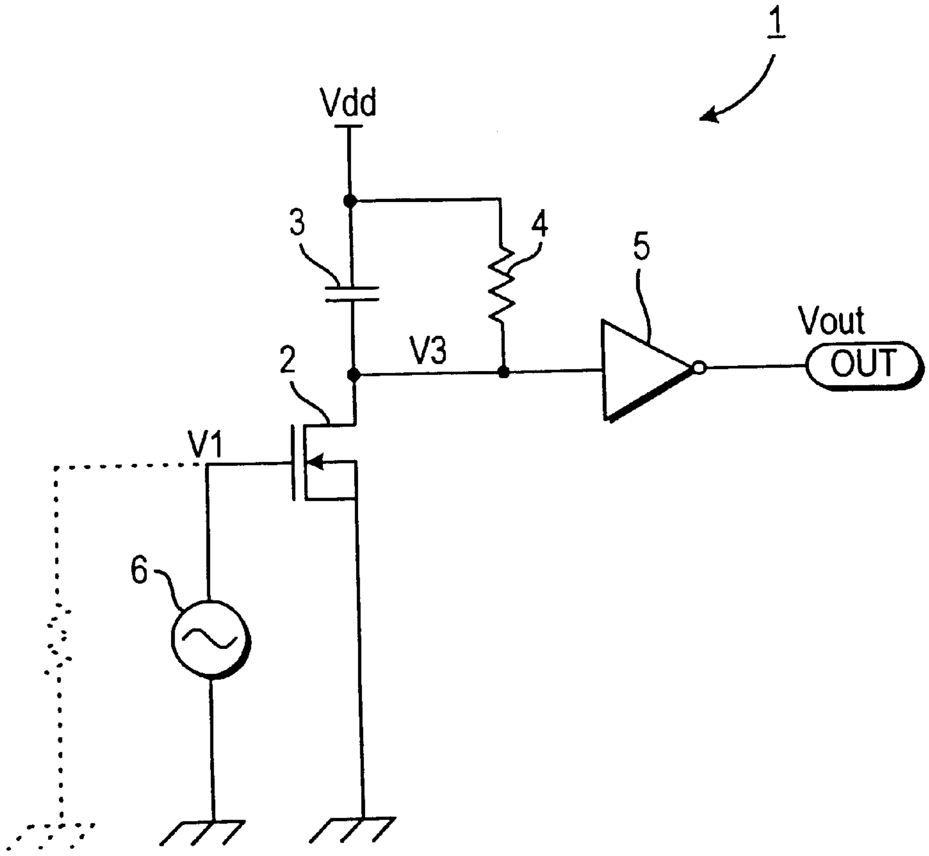
FIG. 2 is a circuit block diagram of a power-generation detection circuit according to the present invention.
Figure 15:
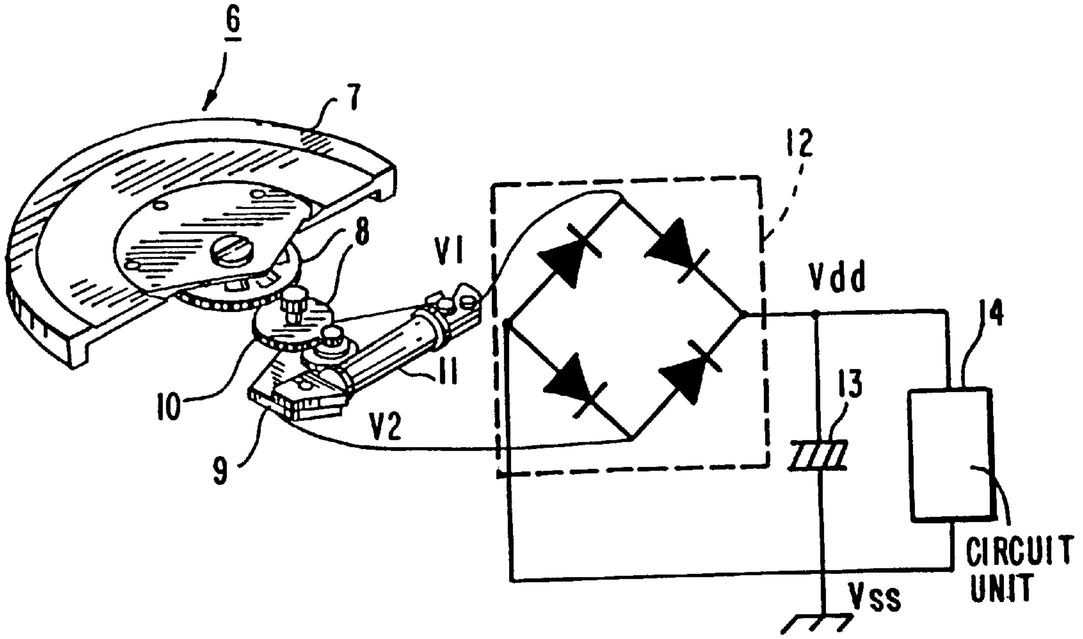
FIG. 15 PRIOR ART
FIG. 15 is a schematic view of a prior art power supply block of an electronic device having a power-generation device constructed in accordance with the prior art.

Referring now to FIGS. 1–2, there is shown a circuit block diagram of an electronic device generally indicated as 50 including a power-generation detection circuit 1 constructed in accordance with the present invention. Elements in FIG. 1 that are similar to elements in FIG. 15 will be denoted with the same reference numerals and a description thereof will be omitted. Referring to FIG. 1, electronic device 50 includes power-generation detection circuit 1. A power save control circuit 30 is coupled between power-generation detection circuit 1 and circuit unit 14. A power-generation device 6 is coupled between power generation-detection circuit 1 and a rectification diode bridge 12. A large-capacity capacitor 13 is connected in parallel with rectification bridge diode and circuit unit 14.

Power-generation detection circuit 1, which is connected to power-generation device 6, further includes a MOS transistor 2 of the n-channel type which receives a V1 output of power-generation device 6 as its gate input. A capacitor 3 is coupled between a voltage Vdd and transistor 2. A pull-up resistor 4 is coupled across capacitor 3. An inverter circuit 5 coupled between pull up resistor 4 and power save control circuit 30 provides an output Vout to power save control 30.

Because power-generation device 6 is connected to the gate of MOS transistor 2, MOS transistor 2 undergoes repeated ON/OFF cycles in response to an AC voltage V1 generated by power-generation device 6. When MOS transistor 2 is used as a switching element, power-generation detection circuit 1 and inverter circuit 5 can be formed using an inexpensive CMOS-IC while the switching element and the voltage detection circuit may be formed using bipolar transistors.

Pull-up resistor 4 functions to fix a voltage value V3 of capacitor 3 to a Vdd potential and generate a leakage current in a no-power-generation state, i.e. when power generation device 6 produces no or minimal power. In a exemplary embodiment, pull-up resistor 4 has a high resistance on the order of several tens to several hundreds MΩ, and may also be formed using a MOS transistor having a high ON resistance. Voltage value V3 of capacitor 3 is sensed by inverter circuit 5 connected to capacitor 3. If power is being generated, inverter circuit 5 outputs a power-generation detection signal Vout that is “HI”.

Although a low-voltage Vss is shown as a reference voltage in this embodiment, as is used in many wrist watch circuits, alternatively a high-voltage Vdd may be also be used as a reference without any difficulty. In addition, AC voltage V1 of power-generation device 6 may be connected to Vss through a high-resistance resistor to stabilize the circuit in the no-power-generation state. In addition, in order to turn off MOS transistor 2 in the no-power-generation state, output voltage V1 of power-generation device 6 must be made stable at Vss. Accordingly, power-generation device 6 is preferably connected to Vss through a resistor element.

Power save control circuit 30 sends a control signal S1 to circuit unit 14 based on power-generation detection signal Vout from inverter circuit 5 of power-generation detection circuit 1 to switch circuit unit 14 into a power save mode. When circuit unit 14 receives control signal S1, circuit unit 14 determines that the power save mode is set and, as a result, cuts power to a mechanical driver or some other functions of circuit unit 14 to reduce power consumption. For example, if circuit unit 14 is a timepiece (especially, a wrist watch), power may be conserved in power save mode by stopping the movement of the second hand or by turning off some other function of the circuit, for e.g., a sensor function, a chronograph function, or a liquid-crystal display function.

Figure 3:
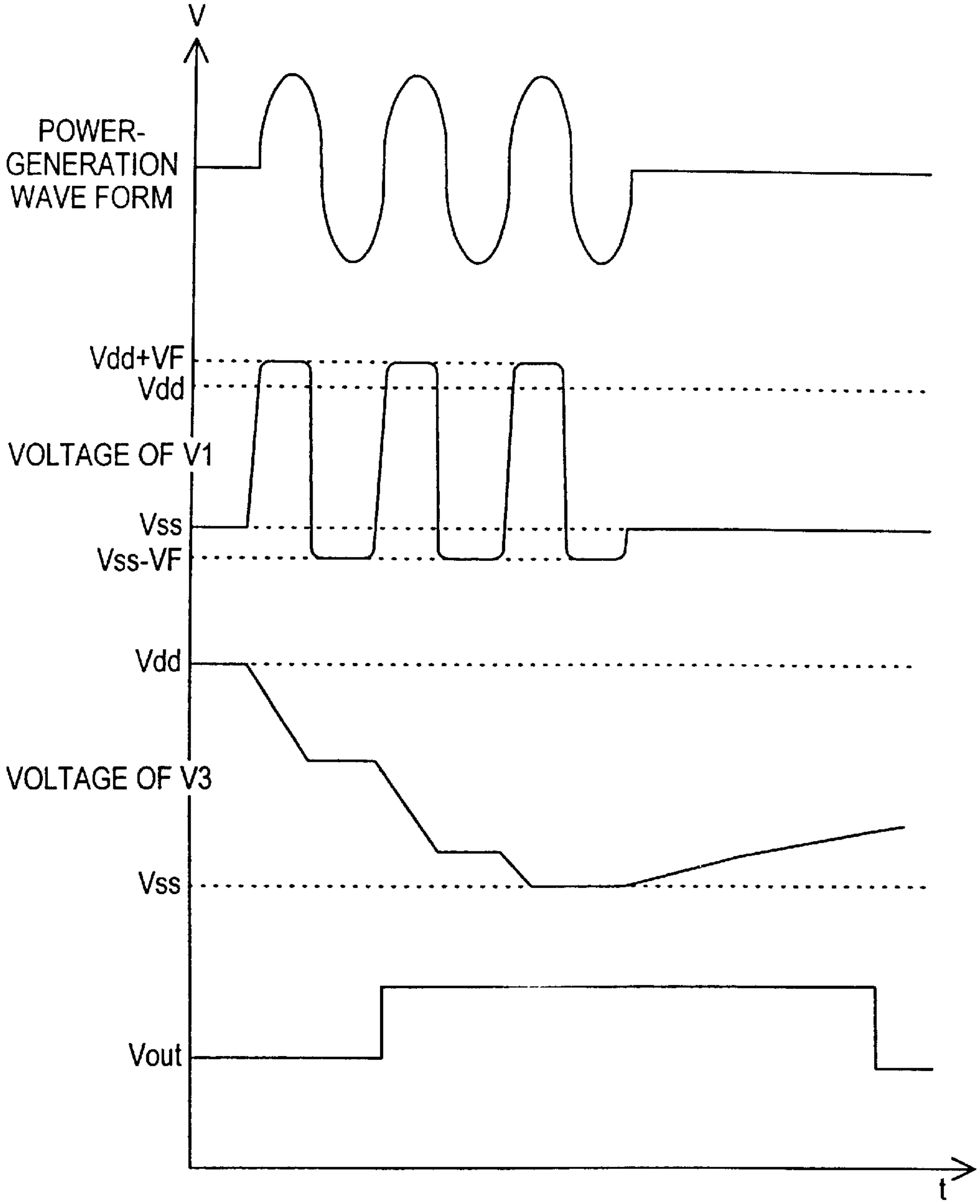
FIG. 3 is a timing chart of the operation of the power-generation detection circuit in accordance with the present invention.

The operation of the power-generation detection circuit 1 according to this embodiment will now be described with reference to the timing chart shown in FIG. 3. When generation of AC power by the power-generation device 6 begins, AC signal V1 having an amplitude of Vdd+VF to Vss−VF' (where VF is the forward voltage of a rectification diode) appears at one terminal of power-generation device 6. A signal V2 having the same amplitude but opposite phase as that of V1 appears at the terminal V2 of power-generation device 6. When power generation begins and voltage V1 rises from Vss to Vdd, MOS transistor 2 is turned ON and capacitor 3 begins to charge. Before power generation occurs, the voltage at V3 is fixed to Vdd by pull-up resistor 4 in the no-power-generation state. However, when power generation occurs and capacitor 3 begins charging, the voltage at V3 begins to fall to Vss. When voltage V1 decreases to Vss, and MOS transistor 2 is turned off, charging of capacitor 3 stops. However, potential V3 is kept constant by capacitor 3. The above operation is repeated while power generation continues until the voltage at V3 stabilizes to Vss. When the voltage at V3 is lower than the threshold value of inverter circuit 5, power-generation detection signal Vout switches from "LOW" to "HI" thereby indicating that power generation is occuring. The response time for power generation to be detected in this manner may be arbitrarily set by either connecting a current-limiting resistor in series with capacitor 3, by changing the characteristics of MOS transistor 2 thereby adjusting the value of the charge current for capacitor 3, or changing the capacitance of capacitor 3.

When power generation stops, V1 is at Vss and MOS transistor 2 is kept in the OFF state. The voltage level at V3 is maintained for a period of time by capacitor 3. However, because capacitor 3 is discharged by a small leakage current generated by pull-up resistor 4, V3 begins to gradually increase from Vss to Vdd. When V3 exceeds the threshold value of inverter circuit 5, power-generation detection signal Vout switches from "HI" to "LOW" so that a no-power-generation state can be detected. The time required to detect a no-power generation state can be arbitrarily set by changing the resistance of pull-up resistor 4 and adjusting the leakage current of capacitor 3. When power-generation detection signal Vout is monitored as described above, the state of power generation can be detected.

Furthermore, if the state of power generation can be detected, setting/canceling of the power save mode can be set/canceled accordingly by power save control circuit 30, and the operation time of circuit unit 14 in no-power-generation state can be lengthened by reducing power consumption.

Embodiment 2

Figure 4:
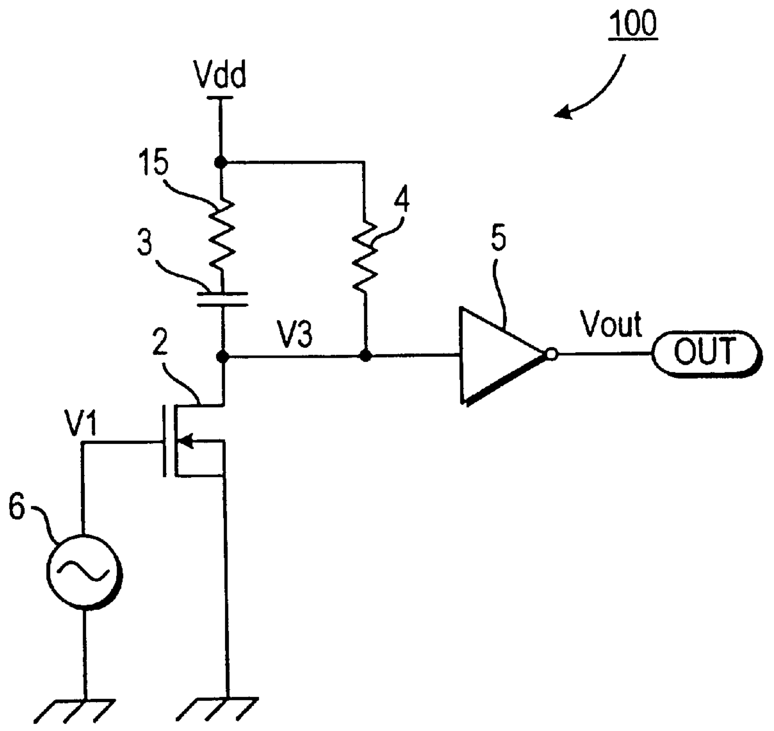
FIG. 4 is a circuit block diagram of a power-generation detection circuit constructed in accordance with a second embodiment of the present invention.

Referring now to FIG. 4, a second embodiment of the power-generation detection circuit, generally indicated as 100, constructed in accordance with the second embodiment of the invention is shown. The difference between power-generation detection circuit 1 and power-generation detection circuit 100 being a current-limiting resistor 15 connected in series with capacitor 3. Because this embodiment is similar to power-generation detection circuit 1, the same reference numerals used in the first embodiment are used in this embodiment and a detailed description thereof will be omitted. When MOS transistor 2 is turned on and capacitor 3 is being charged, the time until power-generation detection signal Vout is output can be adjusted by changing the value of current-limiting resistor 15. Because current-limiting resistor 15 reduces the charge current to capacitor 3, a longer time is required to bring voltage V3 to a level lower than the threshold voltage of inverter 5. Thus, it takes a longer time for power-generation detection signal Vout to be output.

Embodiment 3

Figure 5:
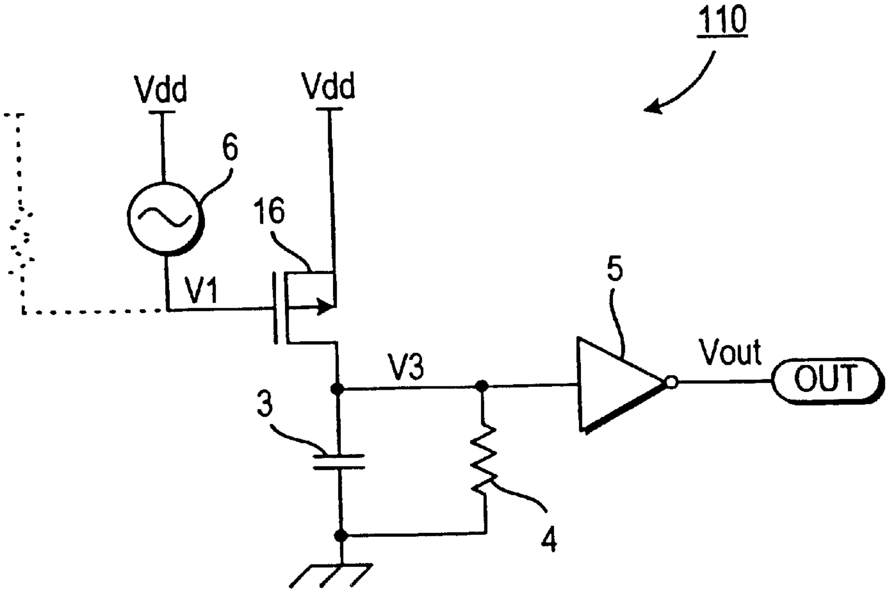
FIG. 5 is a circuit block diagram of a power-generation detection circuit constructed in accordance with a third embodiment of the present invention.

Referring now to FIG. 5, a third embodiment of the power-generation detection circuit, generally indicated as 110, constructed in accordance with the third embodiment of the invention is shown. The difference between power-generation detection circuit 1 and power-generation detection circuit 110 being that a switching MOS transistor 16 of the p-channel type is used. Because this embodiment is similar to power-generation detection circuit 1, the same reference numerals used in the first embodiment are used in this embodiment and a detailed description thereof will be omitted.

In this embodiment, the positions of capacitor 3 and MOS transistor 16 relative to power generation device 6 are reversed as compared to the arrangement of a n-channel MOS transistor 2 and capacitor 3 shown in FIG. 2. In this embodiment, V1 is preferably connected to Vdd through a resistor. Alternatively, a MOS transistor having a high ON resistance may be used. In a no-power-generation state, p-channel MOS transistor 16, is turned off when output voltage V1 of power-generation device 6 is stabilized at Vdd.

Embodiment 4

Figure 6:
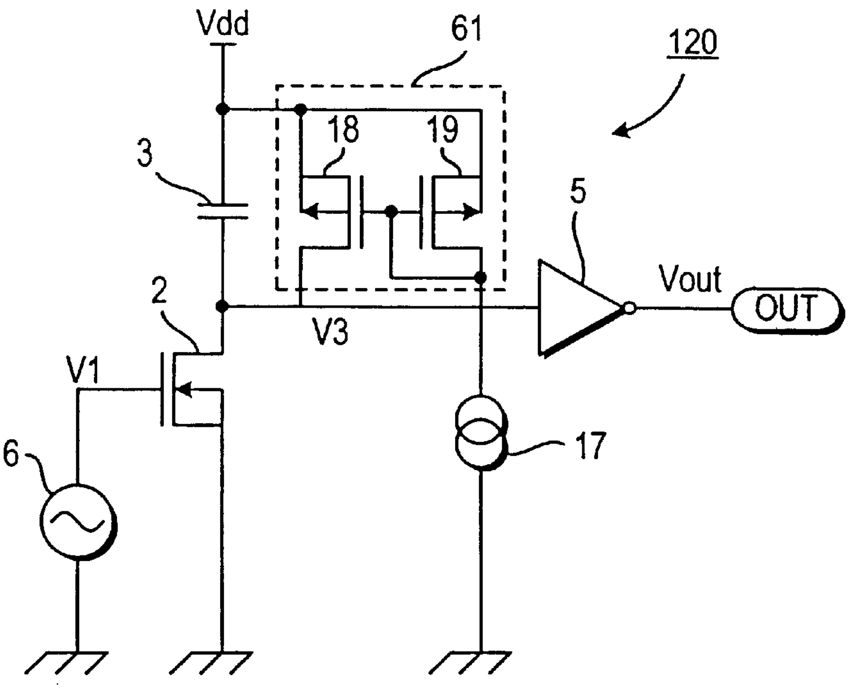
FIG. 6 is a circuit block diagram of a power-generation detection circuit constructed in accordance with a fourth embodiment of the present invention.

Referring now to FIG. 6, a fourth embodiment of the power-generation detection circuit, generally indicated as 120, constructed in accordance with the fourth embodiment of the invention is shown. The difference between power-generation detection circuit 1 and power-generation detection circuit 120 being that a pull-up resistor is formed using a constant-current circuit 61. Because this embodiment is similar to power-generation detection circuit 1, the same reference numerals used in the first embodiment are used in this embodiment and a detailed description thereof will be omitted.

Constant-current circuit 61 is a current mirror circuit that includes a constant-current source 17 and a pair of MOS transistors 18 and 19 connected at the gates which allows a slight constant current to flow from Vdd to V3. To delay the output of power-generation detection signal Vout for a long period of time, the leakage current of capacitor 3 must be reduced so that the resistance of constant current circuit 61 is increased considerably. In this case, the variation in resistance is enlarged, and the output holding time of power-generation detection signal Vout also has a large variation. When power generation detection circuit 120 is constructed using constant-current circuit 61 according to this embodiment, a small leakage current value in the range of several nano-amperes can be set, and the variation in leakage current can be advantageously made considerably smaller than in the previous embodiments in which power-generation detector circuit 1 uses a resistor instead.

Embodiment 5

Figure 7:
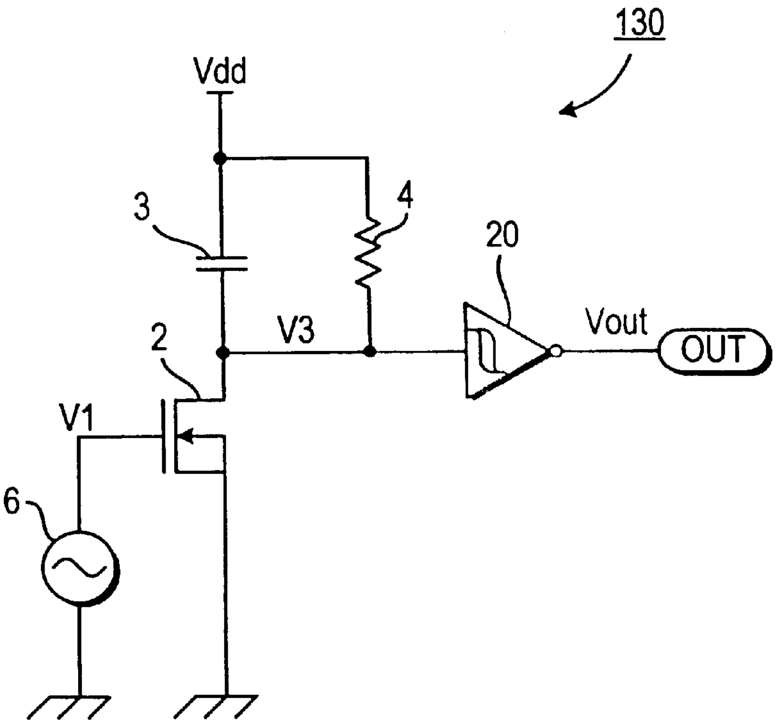
FIG. 7 is a circuit block diagram of a power-generation detection circuit constructed in accordance with a fifth embodiment of the present invention.

Referring now to FIG. 7, a fifth embodiment of the power-generation detection circuit, generally indicated as 130, constructed in accordance with the fifth embodiment of the invention is shown. The difference between power-generation detection circuit 1 and power-generation detection circuit 130 being that a voltage detector 20 is formed using a Schmidt trigger inverter circuit. Because this embodiment is similar to power-generation detection circuit 1, the same reference numerals used in the first embodiment are used in this embodiment and a detailed description thereof will be omitted. When the voltage detector 20 is formed using a Schmidt trigger inverter circuit having hysteresis characteristics, stable power-generation detection can be advantageously performed without being affected by an instantaneous variation in voltage V3 of capacitor 3.

Embodiment 6

Figure 8:
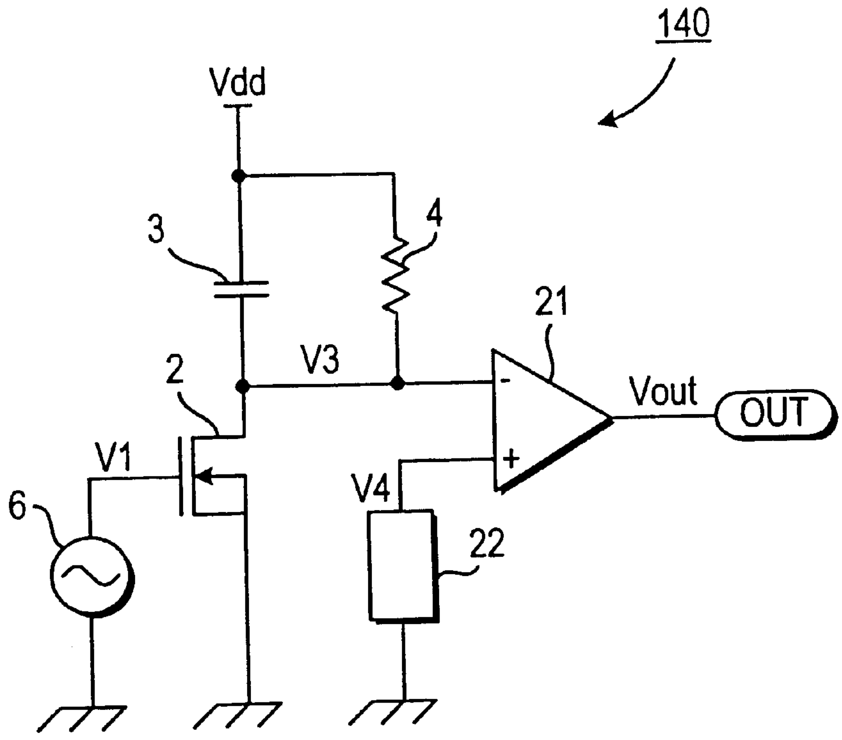
FIG. 8 is a circuit block diagram of a power-generation detection circuit in accordance with as sixth embodiment of the present invention.

Referring now to FIG. 8, a sixth embodiment of the power-generation detection circuit, generally indicated as 140, constructed in accordance with the sixth embodiment of the invention is shown. The difference between power-generation detection circuit 1 and power-generation circuit 140 being that a voltage detector 21 is formed using a comparator circuit 21. Because this embodiment is similar to power-generation detection circuit 1, the same reference numerals used in the first embodiment are used in this embodiment and a detailed description thereof will be omitted. Comparator circuit 21 compares an output voltage V4 from a reference voltage generation circuit 22 with capacitor voltage V3. If V3 is lower than V4, comparator circuit 20 outputs power-generation detection signal Vout set to "HI".

In power-generation detection circuit 1, the voltage changes of power-generation device 6 varies with the charging state of large-capacity capacitor 13 and the voltages at both the ends of large-capacity capacitor 13. Thus, when voltage detection is performed by inverter 5, the threshold voltage of inverter 5 changes with a variation in power supply voltage Vdd. For this reason, power-generation detection time also varies. When voltage detection is performed by comparator circuit 21, as in the present embodiment, the threshold value of power-generation detection is kept constant and is not affected by a variation in power supply voltage. Thus, stable detection with a high precision can be realized.

Embodiment 7

Figure 9A:
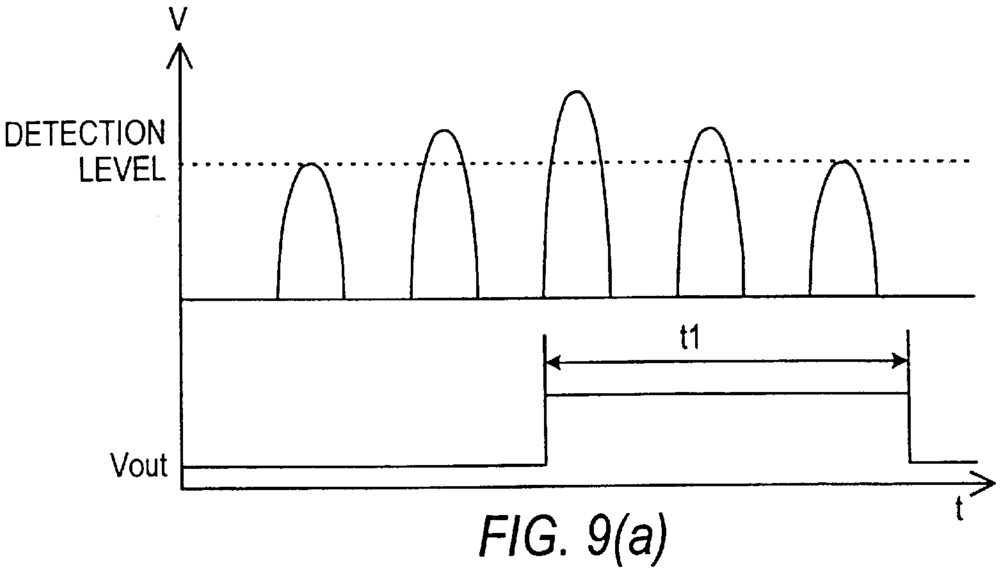
FIGS. 9(*a*) and 9(*b*) are charts showing a comparison between a power-generation device output and a power-generation detection signal over time in accordance with a seventh embodiment of the present invention.
Figure 9B:
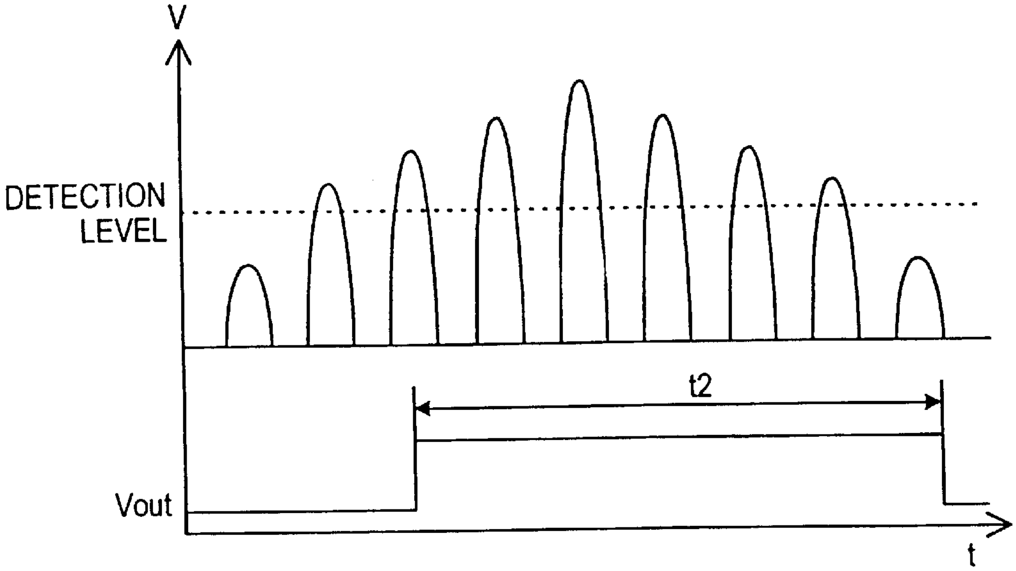

Referring now to FIGS. 9(*a*)–9(*b*), there is shown a chart showing V1 output from power-generation device 6 as a function of time, with the level of V1 varying with the changes in rotating speed of rotor 10, (see FIG. 15) and a comparison between V1 and power-generation detection signal Vout over time. In FIG. 9(*a*) rotor 10 rotates at a low rotating speed, while in FIG. 9(*b*) rotor 10 rotates at a high rotating speed. The voltage level and frequency of V1 output from power-generation device 6 changes as a function of the rotating speed of rotor 10. More specifically, at higher rotating speeds, the voltage level of V1 is higher, and the frequency of V1 is higher. Because of this, the length of output holding time (ON time) of power-generation detection signal Vout varies depending on the power output level of power-generation device 6. More specifically, when output V1 varies slightly, as in FIG. 9(*a*), the output holding time is represented by t1; when the variation of output V1 is greater, as in FIG. 9(*b*), the output holding time is represented by t2, with t1 and t2 having the relationship $t1<t2$. As described above, the power output level of power-generation device 6 can be determined based on the length of the output holding time of power-generation detection signal Vout. Embodiment 7 described above can also be applied to any one of Embodiment 1 to Embodiment 6 described above.

Embodiment 8

Figure 10A:
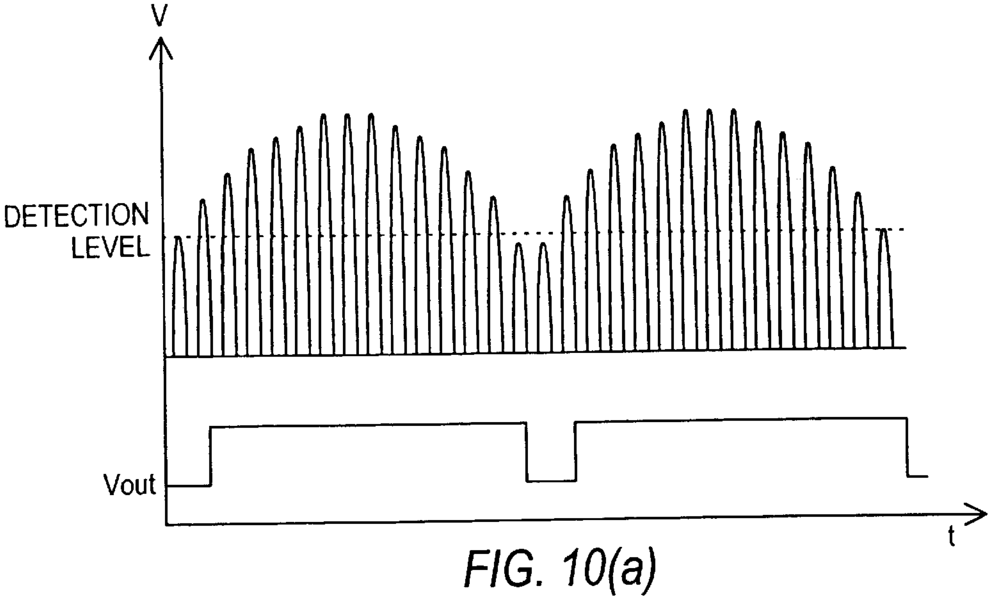
FIGS. 10(*a*) and 10(*b*) are charts showing a comparison between a power-generation device output and a power-generation detection signal over time in accordance with an eight embodiment of the present invention.
Figure 10B:
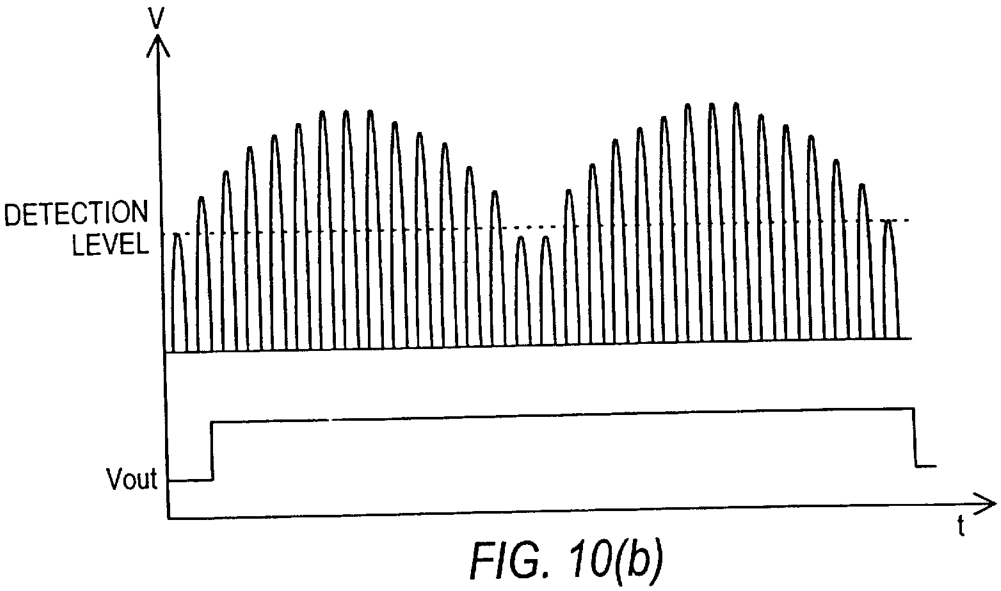

Referring now to FIGS. 10(*a*), 10(*b*), there is shown a chart showing V1 output from power-generation device 6 as a function of time, with the level of V1 changing as a function of the shaking of a wrist watch which causes the power-generation device 6 to generate power, and a comparison between V1 and power-generation detection signal Vout. For example, when power-generation detection circuit 1 is applied to a wrist watch, the rotating speed of rotor 10 changes depending on the motion of the user. More specifically, when the wrist watch is strongly shaken by the user, the output holding time of power-generation detection signal Vout is longer. In contrast, when the user does not strongly shake the watch, the output holding time of power-generation detection signal Vout is shorter. Therefore, when power-generation detection signal Vout for a predetermined period of time is detected, this indicates that the watch was strongly shaken by the user. Accordingly, if circuit unit 14 is previously set to power save mode and output holding time of the power-generation detection signal Vout continues for the predetermined period of time, it indicates that the user desires that power save mode be canceled.

However, power save mode may not always be canceled under these circumstances. For example, when the user strongly shakes the watch, as shown in FIG. 10(*a*), rotating weight 7 is irregularly rotated, causing output V1 from power-generation device 6 to have two amplitude peaks. If the capacitance of capacitor 3 is small, or if the resistance of pull-up resistor 4 inserted in the discharging path of capacitor 3 is low, which causes the discharge current to be large, power-generation detection signal Vout is temporarily discontinued at the trough between the two peaks. This results in the output holding time of power-generation detection signal Vout not corresponding to the strength of the power generation caused by the user strongly shaking the watch. Therefore, because power-generation detection signal Vout is not detected for the predetermined time, power save mode is not canceled as the user desires.

However, as described above, if the capacitance of capacitor 3 is increased, the discharge current from capacitor 3 is reduced thereby preventing power-generation detection signal Vout from being discontinued. Referring now to FIG. 10(*b*), there is shown a chart showing V1 obtained when a user strongly shakes a wrist watch in which the capacitance of capacitor 3 is increased, and also power-generation detection signal Vout as a function of V1. As shown in FIG. 10(*b*), when the capacitance of capacitor 3 is increased, current discharge is reduced and, as a result, power-generation detection signal Vout is continuously output. Therefore, the output holding time of power-generation detection signal Vout corresponds to the strength of power generation, and the power save mode is properly canceled.

In this manner, an increase in the capacitance of capacitor 3 described above is effective especially when, in canceling the power save mode, the wrist watch is strongly shaken by a user.

Although Embodiment 8 described above is applied to the arrangement of Embodiment 1, Embodiment 8 may be applied to not only the arrangement of Embodiment 1, but also to any of the arrangements of Embodiment 2 to Embodiment 7, as a matter of course.

Embodiment 9

Figure 11:
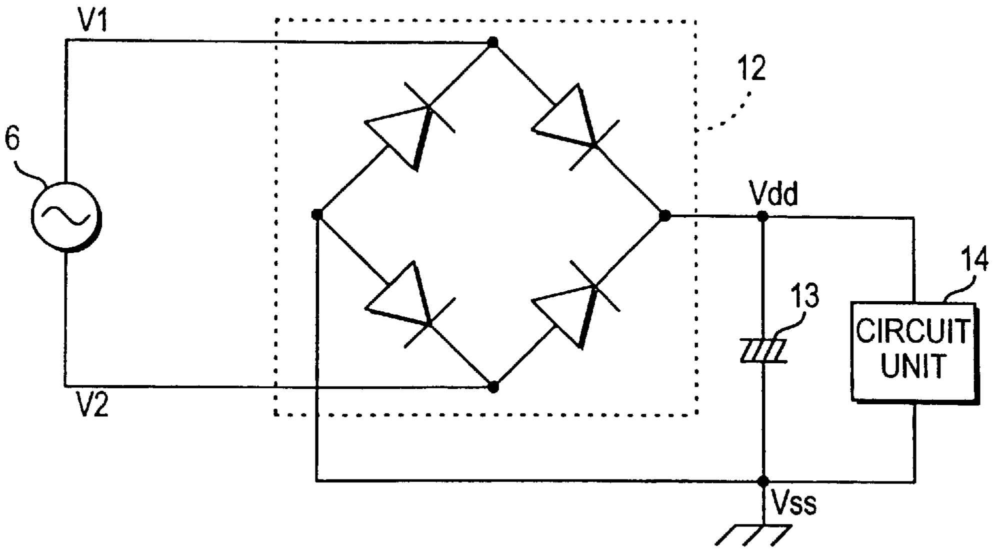
FIG. 11 is a circuit diagram showing a power supply block in accordance with a ninth embodiment of the present invention.
Figure 12:
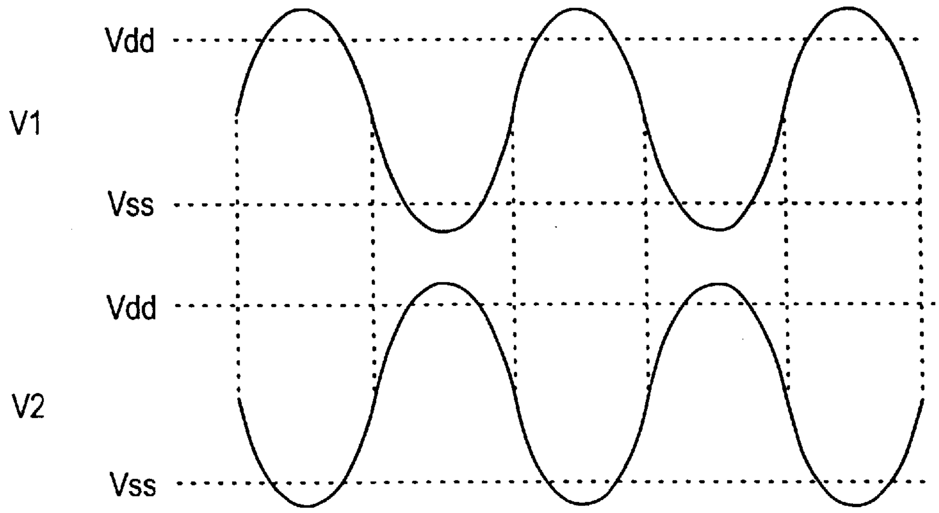
FIG. 12 is a chart showing V1 and V2 outputs from the power-generation device in accordance with the ninth embodiment of the present invention.
Figure 13:
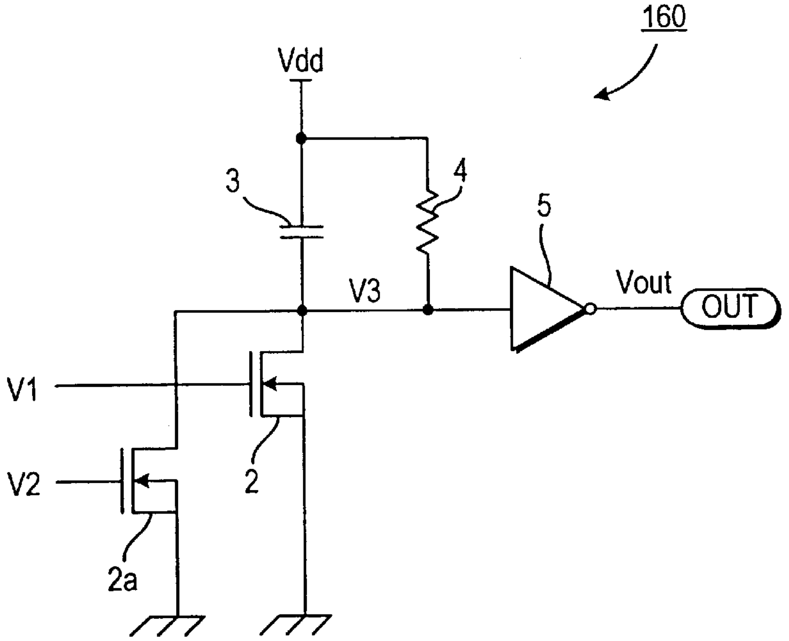
FIG. 13 is a circuit diagram showing a power-generation detection circuit in accordance with the ninth embodiment of the present invention.

Referring now to FIGS. 11–13, a ninth embodiment of the power-generation detection circuit, generally indicated as 160, constructed in accordance with the sixth embodiment of the invention is shown. The difference between power-generation detection circuit 1 and power-generation detection circuit 160 being that a second MOS transistor 2*a* is also used to charge capacitor 3. Because this embodiment is similar to power-generation detection circuit 1, the same reference numerals used in the first embodiment are used in this embodiment and a description thereof will be omitted.

In this embodiment, power-generation detection circuit 160, as shown in FIG. 13, is switched by using V1 and V2 to charge capacitor 3. V1 and V2 are output from power-generation device 6 and have AC waveforms that are out of phase with each other before being rectified by rectification diode bridge 12. V1 is supplied to the gate of MOS transistor 2, and V2 is supplied to the gate of MOS transistor 2*a*. As MOS transistor 2 and MOS transistor 2*a* are alternately turned on/off, the number of switching times is twice the number as that in power-generation detection circuit 1. As a result, the charging time of capacitor 3 becomes shorter, and the voltage at V3 can more rapidly reach Vss if power generation continues. Therefore, the rise time of the power-generation detection signal Vout is shortened.

Although power-generation detection circuit 160 is formed by adding MOS transistor 2*a* to the basic circuit arrangement of power-generation detection circuit 1, MOS transistor 2*a* may also be added to the circuit arrangements of power-generation detection circuit 100, 110, 120, 130 or 140 as a matter of course and provide the benefits of this embodiment.

Figure 16:
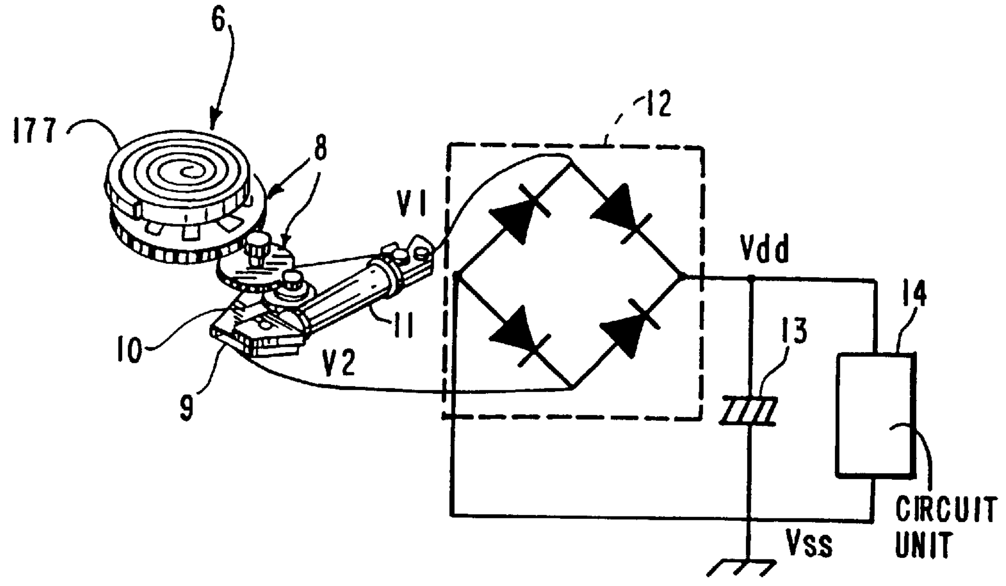
FIG. 16 is a schematic view of a power-generation device that operates in conjunction with the power-generation detection circuit of the present invention.
Figure 17:
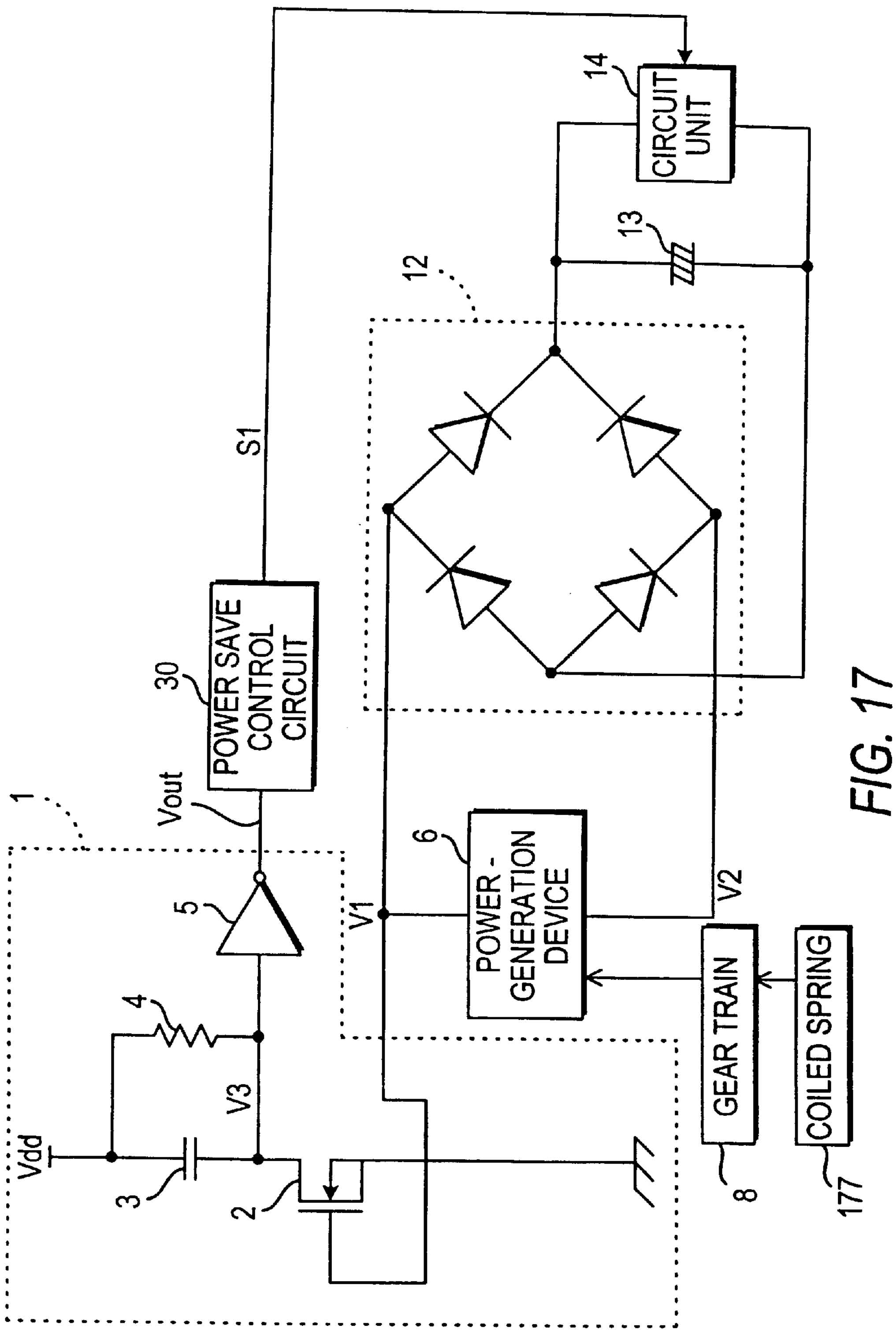
FIG. 17 is a circuit diagram showing the power-generation device of FIG. 16.
Figure 18:
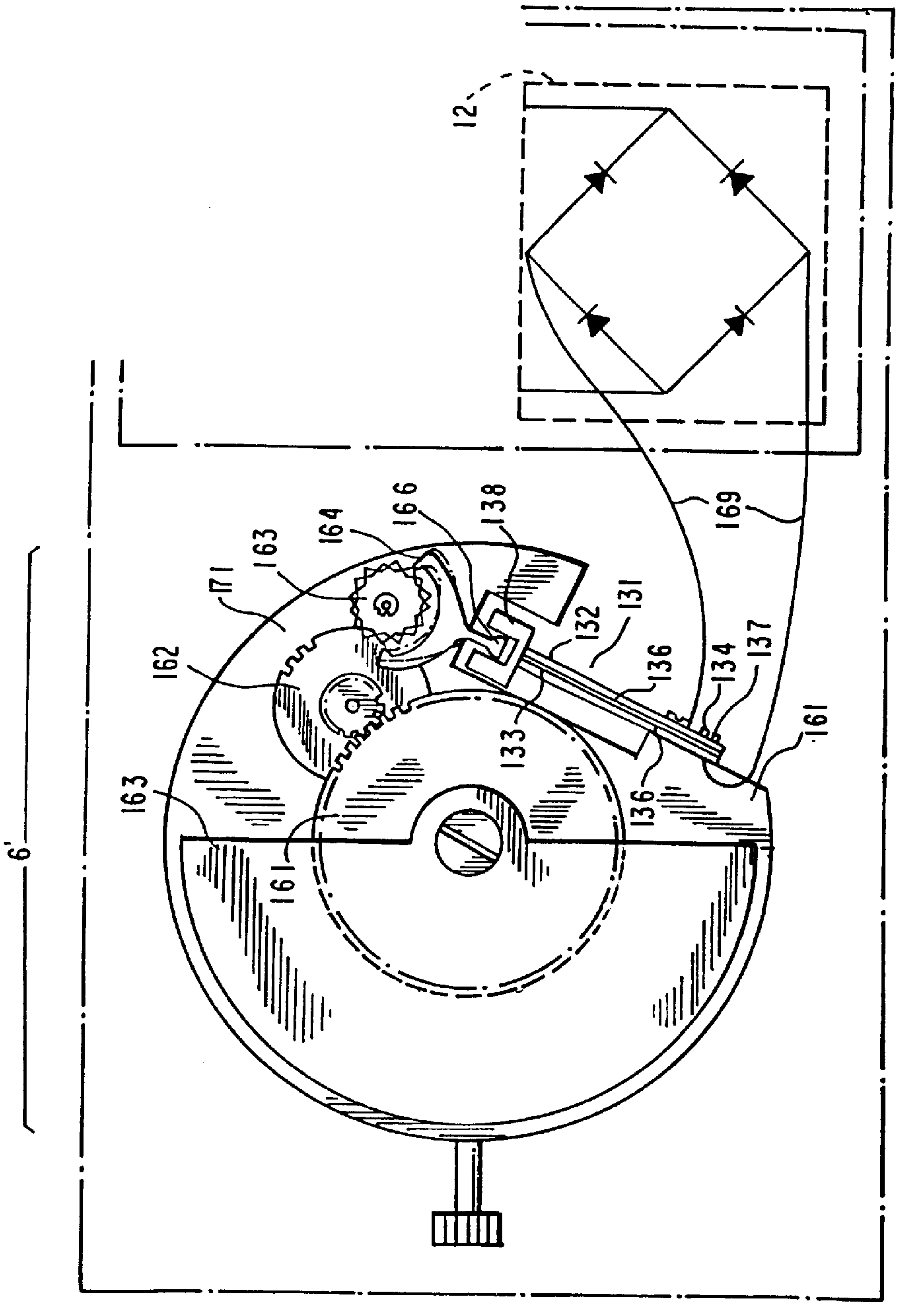
FIG. 18 is a schematic view of a power-generation device of an alternative embodiment that operates in conjunction with the power-generation detection device of the present invention.

In each of Embodiments 1 to 9, power-generation device 6 can be an electromagnetic power-generation device which transmits the rotating motion of rotating weight 7 to rotor 10 causing output coil 11 to generate electromotive force. However, power-generation device 6 is not limited to the above embodiment. For example, as shown in FIGS. 16–17, power-generation device 6 may be a device in which a rotating motion is generated by recovery force of a coiled spring 177 to generate electromotive force by the rotating motion. Alternatively, power-generation device 6' may be constructed as in FIG. 18 comprising a vibration arm 131, in the shape of a cantilevered beam, fixed to a case (base plate) 151. Piezoelectric layers 132 are provided on both sides of vibration arm 131, so that electric power generated in these piezoelectric layers 132 can be supplied to diode bridge 12 via an electrode 135 and wiring 159 on the surface thereof. A weight 138 is attached at the tip 133 of the vibration arm 131 so that when this weight 138 is moved by a drive system 171 which operates as a displacement application apparatus, a displacement is applied to vibration arm 131. Also, since vibration arm 131 is a cantilevered beam, after it is vibrated by drive system 171, the tip 133 of vibration arm 131 becomes a free end and freely vibrates with, while the opposite end thereof is fixed to the base plate 151 by a screw 137 serving as a support end 134, and the electric power generated thereby in the piezoelectric layer 132 is supplied to diode bridge 12.

Drive system 160 has a rotation weight 153 which is rotationally moved inside case 151. A rotation weight wheel 161 is coupled to weight 153 to rotate therewith. Rotation weight wheel 161 is provided with gear teeth and meshes with an intermediate wheel 162 rotably mounted on base plate 151. A cam drive wheel 163, rotatably mounted on base plate 151, is rotated by intermediate wheel 162. A cam 164 is pivotably mounted on base plate 151 and includes a hitting section disposed within weight 138. Cam driving wheel 163 pivots cam 164 between a first position and a second position.

When rotation weight 153 is attached to a wrist watch or the like, rotation weight 153 rotates in conjunction with the motion of the user's arm or body or the like, and electric power can be generated using the force thereof. The motion of rotation weight 153 is transmitted to an intermediate wheel 162 through a rotation weight wheel 161 and is accelerated. The motion of the intermediate wheel 162 through a rotation weight wheel 161 and is accelerated. The motion of the intermediate wheel 162 is transmitted to a cam drive wheel 163. A cam 164 is driven from side to side by this cam drive wheel 163, and a hitting section 165 which moves in linkage with the cam 164 housed inside weight 138 of the vibration arm is moved. Therefore, when the user moves his/her arm or body, rotation weight 153 rotates and cam 164 reciprocates parallel to the plane of the device as a result of that force. Hitting section 165 of cam 164 hits weight 138 of vibration arm 131, causing weight 138 to be hit repeatedly at appropriate intervals. The respective hittings by hitting section 165 cause a predetermined initial displacement to be applied to vibration arm 131. When cam 164 is released from vibration arm 131, subsequent free vibrations are excited in vibration arm 131. Since these free vibrations cause an electromotive force to be generated in piezoelectric layer 132, this electromotive force can be supplied to diode bridge 12 through electrode 135 and the wiring 159.

In power-generation device 6' constructed in accordance with this embodiment, the initial displacement applied from hitting section 165 to vibration arm 131 varies due to the pivot speed and pivot range of rotation weight 153. Since the acceleration of hitting section 165 increases if the rotation speed of rotation weight 153 increases, the initial displacement of vibration arm 131 increases similarly and, as a result, the initial value (the initial electromotive voltage) of the voltage generated due to the initial displacement becomes higher. Also, since the number of times that the hitting section 165 hits vibration arm 131 increases, if the pivot range (angle) of rotation weight 153 is increased, the period in which generation of electric power is possible while the rotation weight 153 rotates once is also increased.

The electronic device to which power-generation detection circuit 1 can be applied, in accordance with the present invention, is not limited to a wrist watch but may be included in any electronic device including a pocket watch, table timepiece, a pocket calculator, a portable telephone, a portable personal computer, an electronic organizer, or a portable radio. Power-generation detection circuit 1 of the present invention may also be used to recognize a charge amount of a large-capacity capacitor and to prevent an overvoltage from being applied in a power-generation state.

Figure 14:
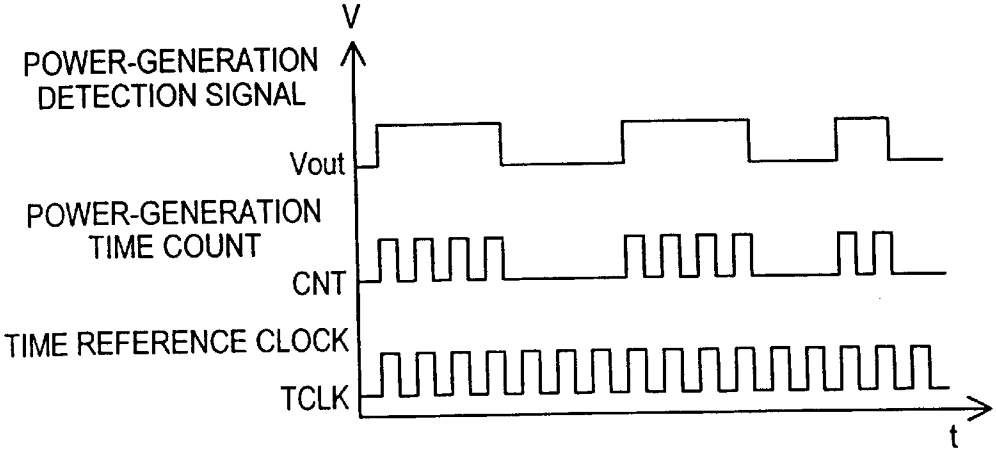
FIG. 14 is a timing chart of the power-generation detection circuit of the present invention.
Figure 19:
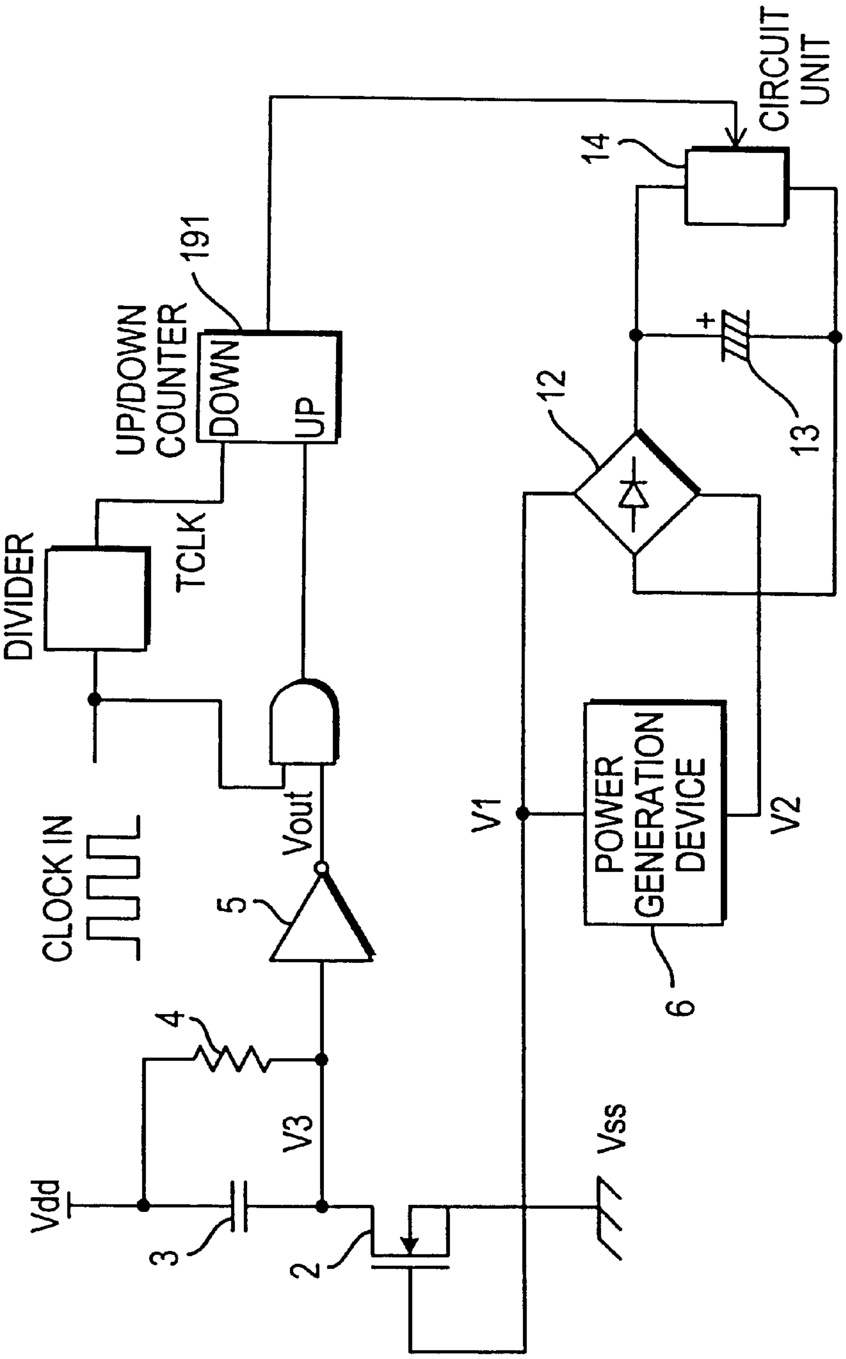
FIG. 19 is a circuit diagram of a power-generation device in which the charge amount may be detected in real-time.

An application of power-generation detection circuit 160 described above is shown in FIGS. 14 and 19, in which the output holding time (time in a HI state) of power-generation detection signal Vout is counted, and the difference between the count value CNT and a time reference timepiece TCLK is counted by an up-down counter 191 or the like, so that a charge amount is detected in real time. When the charge amount is detected, the user can be notified.

When a circuit such as a constant-current generation circuit which is driven by sampling to perform a low-power operation is used, such a circuit is disadvantageously weak in a variation of power supply voltage (Vss). In a period in which power-generation detection signal Vout is set in a HI state (i.e. a power-generation detection state), a sampling duty of a constant-current generation circuit which is driven by sampling is increased, or the constant-current generation circuit is always driven, so that an erroneous operation or characteristic degradation caused by the variation in power supply voltage of the circuit can be prevented.

Large-capacity capacitor 13 shown in FIG. 1 has a drawback in that because of the internal resistance of large-capacity capacitor 13, voltages at both ends of large-capacity capacitor 13 are higher in a power-generation state than in a stationary state and overcharging occurs. To prevent overcharging in a state wherein the voltage of large-capacity capacitor 13 is equal to or higher than a predetermined voltage, if power generation is detected by power-generation detection circuit 1 (power-generation detection signal Vout is set in a HI state), a limiter circuit is operated, so that large-capacity capacitor 13 is not overcharged.

Because the present invention is arranged as described above, the present invention has the following advantages. When charging/discharging of a capacitor is controlled by a simple arrangement which includes a MOS transistor, a capacitor, and an inverter circuit to detect the voltage of the capacitor, the power-generation state of a power-generation device can be detected. By using the leakage current of a pull-up resistor, a state wherein power generation is stopped can also be detected The detection time of a power-generation detection signal Vout can be arbitrarily adjusted by connecting a current-limiting resistor in series with the capacitor or changing the capacitance of the capacitor.

When a constant-current circuit is used in place of a resistor, a small leakage current of the capacitor can be set without variation, and power-generation detection at a high precision can be performed.

When the voltage detector includes a Schmidt trigger inverter circuit, its hysteresis characteristics make it possible to perform stable power-generation detection without being influenced by a variation in the voltage across the capacitor.

In addition, when the voltage detector includes a comparator circuit, an arbitrary threshold value can be set, and stable power-generation detection can be performed without being influenced by a variation in power supply voltage.

Furthermore, when the output holding time of power-generation detection signal Vout is considered, the strength of power generation can be known according to the output holding time of the power-generation detection signal Vout.

It will thus be seen that the objects set forth above, those made apparent from the preceding description, are efficiently attained and, because certain changes may be made in the above construction without departing from the spirit and scope of the invention, it is intended that all matter contained in the above description are shown in the accompanying drawings shall be interpreted as illustrative and not in a limiting sense.

It is also to be understood that the following claims are intended to cover all the generic and specific features of the invention herein described, and all statements of the scope of the invention which, as a matter of language, might be said to fall therebetween.

Embodiment 10

Figure 22:
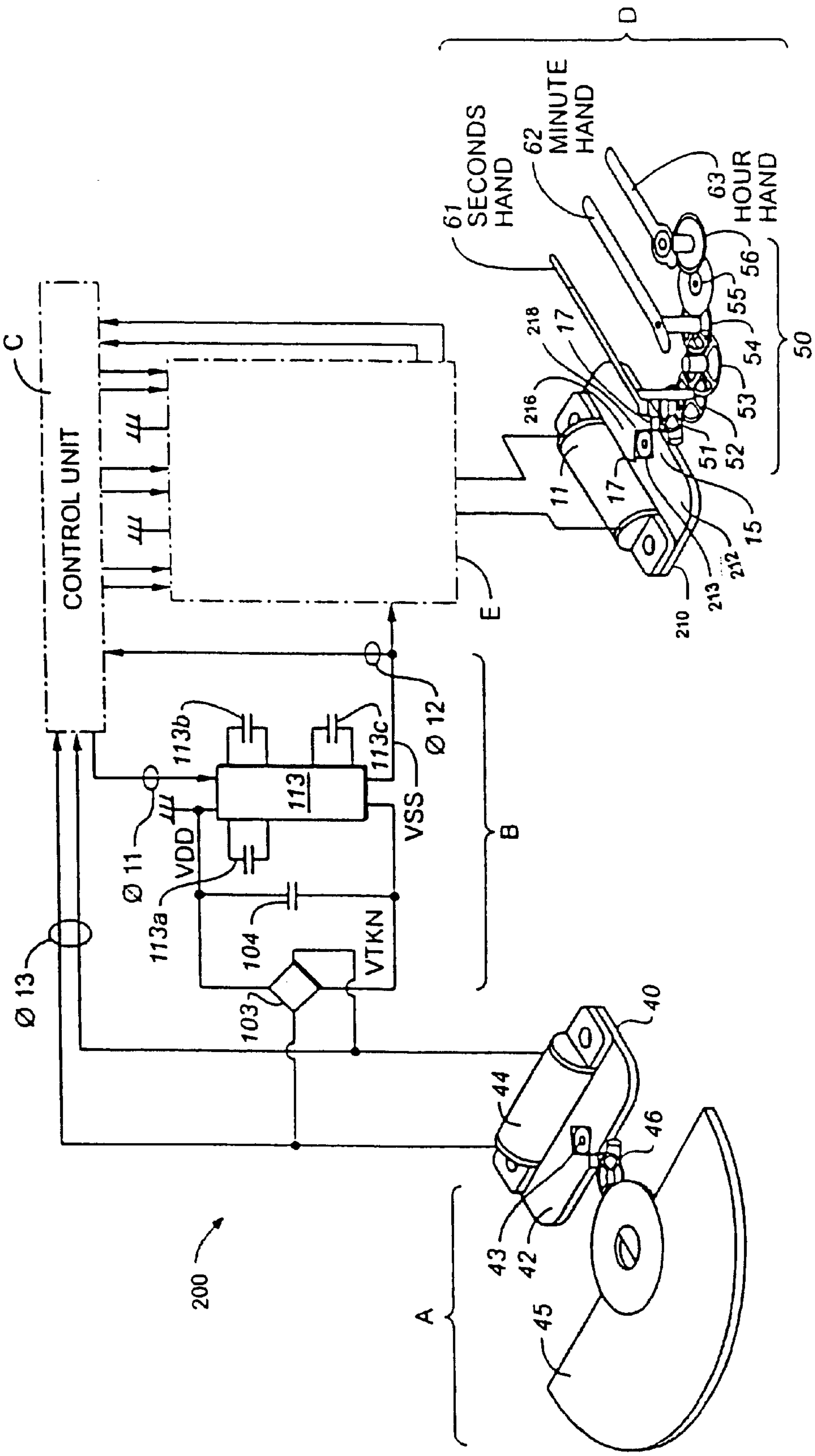
FIG. 22 illustrate the schematic configuration of a timepiece apparatus of an embodiment of the invention.

With reference to FIG. 22, the timepiece apparatus 200 is a watch, which is used by a user wearing a strap connected to the main body of the apparatus around the wrist.

The timepiece apparatus 200 is largely formed of a generator unit A for generating AC power, a power supply unit B for rectifying and storing the AC voltage from the generator unit A and for supplying power obtained by increasing or decreasing the stored voltage to the elements of the apparatus, a control unit C for detecting the power generation state of the generator unit A and for controlling the entire apparatus based on a detection result, a hand-moving mechanism D for driving hands, and a driving unit E for driving the hand-moving mechanism D based on a control signal from the control unit C.

The generator unit A largely includes a generator device 40, an oscillating weight 45 which oscillates within the device in response to the movement of a user's arm so as to convert kinetic energy to rotational energy, and an accelerating gear 46 for converting (accelerating) the oscillation of the oscillating weight to a required number of oscillations so as to transfer it to the generator device 40.

The oscillations of the oscillating weight 45 are conveyed to generator rotor 43 via the accelerating gear 46 so as to rotate the generator rotor 43 within a generator stator 42. Accordingly, the generator device 40 serves as an electromagnetic-induction-type AC generator device for outputting power, to the outside, which is induced in a generator coil 44 connected to the generator stator 42.

Thus, the generator unit A generates power by utilizing energy related to user's daily life so as to drive the timepiece apparatus 200 by using the power.

The power supply unit B is formed of a rectifier circuit 103, a storage device (large-capacitance capacitor) 104, and a step-up/down circuit 113.

The step-up/down circuit 113 increases or decreases the voltage in multiple stages by using a plurality of capacitors 113*a*, 113*b*, and 113*c* so as to adjust the voltage to be supplied to the driving unit E by a control signal $\phi$11 from the control unit C. An output voltage of the step-up/down circuit 113 is supplied to the control unit C with a monitor signal $\phi$12, thereby enabling the control unit C to monitor the output voltage and to determine from a small increase or decrease of the output voltage whether the generator unit A is generating power. The power supply unit B sets VDD (high potential) as a reference potential (GND) and generates VTKN (low potential) as a power supply voltage.

According to the above description, it is detected whether power is generated by monitoring the output voltage of the step-up/down circuit 113 by using the monitor signal $\phi$12. However, in a circuit configuration without a step-up/down circuit, it may be detected whether power is generated by directly monitoring the low-potential power supply voltage VTKN.

The hand-moving mechanism D is as follows. A stepping motor 10 used in the hand-moving mechanism D, which is also referred to as a pulse motor, a stepper motor, a step motor, or a digital motor, is a motor which is often used as an actuator of a digital control unit and is driven by a pulse signal. These days, many smaller and lighter stepping motors are being used as actuators for use in portakle-type small electronic apparatuses. Typical examples of such electronic apparatuses are timing devices, such as electronic timepieces, time switches, and choreographs.

The stepping motor 210 of this example includes a driving coil 11 for generating a magnetic force by a driving pulse supplied from the driving unit E, a stator 212 excited by this driving coil 11, and a rotor 213 rotated by a magnetic field which is excited within the stator 212. The stepping motor 210 is PM type (permanent magnet rotation type) in which the rotor 213 is formed of a disc-type bipolar permanent magnet. The stator 212 is provided with a magnetically saturated portion 17 so that different magnetic poles are generated in the corresponding phases (poles) 15 and 216 around the rotor 213 by the magnetic force generated by the driving coil 11. Moreover, in order to define the rotating direction of the rotor 213, an inner notch 218 is provided at a suitable position in the inner circumference of the stator 212, whereby a clogging torque is generated to stop the rotor 213 at a suitable position.

The rotation of the rotor 213 of the stepping motor 210 is conveyed to the individual hands by a wheel train 50, which is formed of a fifth wheel and pinion 51, a fourth wheel and pinion 52, a third wheel and pinion 53, a second wheel pinion 54, a minute wheel 55, and an hour wheel 56, meshed with the rotor 213 via the pinions. A seconds hand 61 is connected to the shaft of the fourth wheel and pinion 52, a minute hand 62 is connected to the shaft of the second wheel and pinion 54, and an hour hand 63 is connected to the shaft of the hour wheel 56. Time is indicated by these hands, operatively associated with the rotation of the rotor 213. A transfer system (not shown) for displaying the day, month, and year may be connected to the wheel train 50.

Then, the driving unit E supplies various driving pulses to the stepping motor 210 under the control of the control unit C. More specifically, by applying control pulses having different polarities and pulse widths at different times from the control unit C, driving pulses having different polarities, or detention pulses for exciting an induction voltage for detecting the rotation and the magnetic field of the rotor 213, are supplied to the driving coil 11.

An overview of the operation of the generator AC magnetic-field detection circuit 106 is an follows.

The timepiece controller 105 outputs the generator AC magnetic-field detection timing signal SB, which becomes an "H" level at a predetermined timing, to the circuit 106.

As a result, when the generation-detecting result signal SA becomes an "H" level by detecting power generation while a generator AC magnetic-field is to be detected, the circuit 106 determines that an AC magnetic field is generating from the generator and outputs an "H"-level output signal.

Circuit 106 then outputs the "H"-level generator AC magnetic-field detection result signal SC, indicating that an AC magnetic field generated by the generator has been detected, to the duty down counter 107, the high-frequency magnetic-field detection circuit 110, and the AC magnetic-field detection circuit 111 until the detection-result reset signal FEGL becomes an "H" level to reset the detection result.

The operation of the duty down counter 107 is discussed below.

The timepiece controller 105 outputs the predetermined clock signal CK (not shown) to counter 107.

As a result, counter 107 performs counting by dividing the clock signal CK by n, and outputs a counted result to the timepiece controller 105 as the normal-motor-driving-pulse duty down signal SH.

Meanwhile, if the "H"-level reset control signal RS is output from the timepiece controller 105 or if the "H"-level generator AC magnetic-field detection result signal SC is output from the generator AC magnetic-field detection circuit 106, circuit 107 outputs an "H"-level output signal so as to reset the counter value of the counter.

That is, the duty down counter 107 is operated so as not to perform duty down when the reset control signal RS is input from the timepiece controller 105 or when the "H"-level generator AC magnetic-field detection result signal SC is input from the generator AC magnetic-field detection circuit 106.

The operation of the rotation detection circuit 112 is discussed below.

When neither a high-frequency magnetic field nor an AC magnetic field is detected, and when the "L"-level rotation detection result signal SG is output, the timepiece control circuit 105 outputs the "H"-level rotation-detection timing signal SSP2 based on the rotation-detection timing-control signal SCSP2 so that rotation is detected. Then, the rotation detection circuit 112 is enabled.

Consequently, when the rotation-detection timing signal SSP2 becomes an "H" level and when the raw rotation-detection result signal SG0 is an "H" level, namely, when an electromotive force originating from the rotation of the pulse motor 210 is generated while the rotation is being detected.

Circuit 112 outputs the "H"-level rotation-detection result signal SG from the time when the rotation-detection result signal SG from the time when the rotation of the pulse motor 210 is detected to when a subsequent detection-result reset the detection result.

The operation of the AC magnetic-field detection circuit 111 is similar to that of the high-frequency magnetic-field detection circuit 110, except for the detection timing and the detection object.

When the high-frequency/AC magnetic-field detection timing signal SSP012 becomes an "H" level and when a high-frequency magnetic field (or AC magnetic field) is generated around the pulse motor 210 when detecting a high-frequency magnetic field (or an AC magnetic field), circuit 110 outputs an "H"-level output signal, indicating that a high-frequency magnetic field (or AC magnetic field) has been detected.

Upon receiving the "H"-level output signal, indicating that a high-frequency magnetic field (or AC magnetic field) has been detected, or upon receiving an "H"-level generator AC magnetic-field detection result signal SC, indicating that an AC magnetic field generated by the generator has been detected, the circuit 110 outputs the "H"-level high-frequency magnetic-field detection result signal SE (or AC magnetic-field detection result signal SF) from the time when a high-frequency magnetic field (or AC magnetic field) around the pulse motor 210 is detected to when a subsequent detection-result reset signal FEGL becomes an "H" level to reset the detection result.

The configuration and the operation of the correcting-driving-pulse output determining circuit 108 is described below.

When a high-frequency magnetic field or an AC magnetic field is detected, and when the rotation of the pulse motor 210 is not detected, the correcting-driving-pulse output determining circuit 108 outputs the correcting driving pulses P2+Pr as the correct driving pulses SJ.

Figure 24:
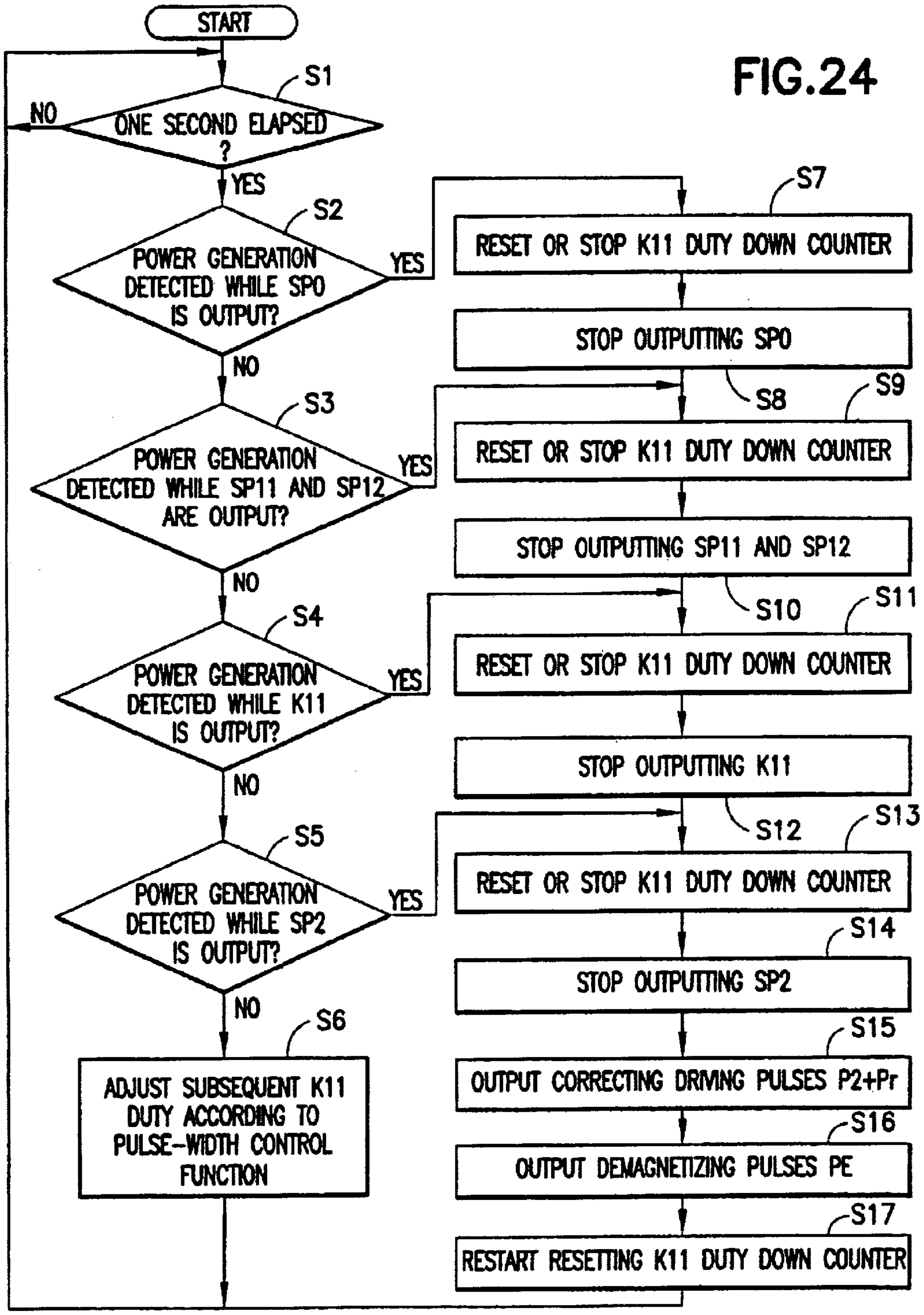
FIG. 24 is a processing flow chart of an embodiment of the invention.

A description is given below of the operation of a timepiece apparatus with reference to the flow chart of FIG. 24.

It is first determined whether one second has elapsed after the timepiece apparatus 1 reset or the previous driving pulse was output (step S1).

If it is determined in step S1 that one second has not elapsed, it is not the time to output a driving pulse, and thus, the timepiece apparatus 1 enters the waiting state.

It is determined in step S1 that one second has elapsed, it is determined by the generation detecting circuit 102 whether power generation for charging the storage device 104 has been detected while the high-frequency magnetic-field detection pulse signal SP0 is being output (step S2).

More specifically, the generation detecting circuit 102 detects for power generation, based on the output voltage monitor signal SM (corresponding to the symbol $\phi$12 in FIG.

1) from the step-up/down circuit 113 or based on a change in the stored voltage of the storage device 104, whether the generator portion 101 is generating sufficient power for charging the storage device 104. The generation-detecting result signal SA to the generator AC magnetic-field detection circuit 106.

Processing to be performed when power generation for charging the storage device 104 is detected by the generation detecting circuit 102 while the high-frequency magnetic-field detection pulses SP0 are being output.

If it is determined in step S2 that power generation for charging the storage device 104 is detected by the generation detecting circuit 102 while the high frequency magnetic-field detection pulse signal SP0 are being output (step S2; Yes), the duty down counter for lowering the duty ratio so as to reduce the effective power of the normal motor-driving pulses K11 is reset (set to a predetermined initial ditty-down-counter value), or counting down of the duty down counter is discontinued (step S7).

In this case, counting by the duty down counter means driving with normal motor-driving pulses K11 of a lower duty ratio when the pulse motor is subsequently driven. However, because of an AC magnetic field from the generator portion 101 for charging the storage device 104, the pulse motor cannot be driven by the normal motor-driving pulses K11, and thus, the output of correcting driving pulses is encouraged.

Accordingly, the duty down counter is reset, or counting down of the duty down counter is discontinued, thereby preventing a reduction in the duty ratio of the normal motor-driving pulses K11 used for subsequently driving the pulse motor.

Then, the output of the high-frequency magnetic-field detection pulses SP0 is discounted (step S8).

Subsequently, the duty down counter for lowering the duty ratio so as to reduce the effective power of the normal motor-driving pulses K11 is reset (set to a predetermined initial duty-down-counter value), or counting down of the duty down counter is discontinued (step S9). This processing is provided for the case in which a determination at step S3, which will be described below, is Yes, and since the processing has already been executed in step S7, it is not performed in step S9 in practice.

Then, the output of the AC magnetic-field detection pulses SP11 and the AC magnetic-field detection pulses P12 is discontinued (step S10).

Subsequently, the duty down counter for lowering the duty ratio so as to reduce the effective power of the normal motor-driving pulses K11 is reset (set to a predetermined initial duty-down-counter value), or counting down of the duty down counter is discontinued (step S11). This processing is provided for the case in which a determination at step S4, which will be described below, is Yes, and since the processing has already been executed in step S7, it is not performed in step S11 in practice.

Then, the output of the normal driving motor pulses K11 is discontinued (or suspended)(step S12).

Subsequently, the duty down counter for lowering the duty ratio so as to reduce the effective power of the normal motor-driving pulses K11 is reset (set to a predetermined initial duty-down-counter value), or counting down of the duty down counter is discontinued (step S13). This processing is provided for the case in which a determination at step S5, which will be described below, is Yes, and since the processing has already been executed in step S7, it is not performed in step S13 in practice.

Then, the output of the rotation detection pulses SP2 is discontinued (step S14).

The correcting driving pulses P2+Pr are then output (step S15). In this case, in actuality the correcting driving pulses P2 drive the pulse motor 210, and the correcting driving pulses Pr are used for speedily shifting the pulse motor to a steady state by inhibiting vibrations after the rotor is rotated after driving the pulse motor. Then, in order to cancel a residual magnetic flux accompanied by an application of the correcting driving pulses P2+Pr, demagnetizing pulses PE of the opposite polarity to the correcting driving pulses P2+Pr are output (step S16).

The role of the demagnetizing pulses PE is discussed below.

Intrinsically, an induction voltage must be generated in the motor driving coil by a leakage flux of the generator.

However, when the AC magnetic-field detection voltage based on the AC magnetic-field detection pulses exceeds a threshold, by an application of the correcting driving pulses P2+Pr having a large effective power, an induction voltage is not generated in the motor driving coil because of a residual magnetic flux.

Moreover, normally, the detection voltage based on the rotation detection pulses SP2 when the pulse motor is not rotated does not exceed a threshold. However, because of an influence of a residual magnetic flux after applying the correcting driving pulses P2+Pr, a leakage flux of the generator is superimposed on the detection voltage, which thus may exceed the threshold and may be erroneously considered as a detection voltage when the pulse motor is rotated.

Thus, in order to eliminate such an adverse influence, the residual magnetic flux is canceled by the demagnetizing pulses PE having the opposite polarity to the correcting driving pulses P2+Pr.

In this case, it is more effective to output the demagnetizing pulses PE immediately before an external magnetic field is detected.

The pulse width of the demagnetizing pulses PE is narrow (short) enough so as not to rotate the rotor, and a plurality of intermittent pulses may be desirably be provided in order to further enhance the demagnetizing effect.

Upon completion of outputting the demagnetizing pulses PE, counting of the duty down counter is restarted (step S17), and the duty ratio of the normal driving pulses K11 is set so that power consumption can be minimized and the correcting driving pulses P2+Pr are not output.

The process then returns to step S1, and processing similar to the above-described processing is repeated.

Processing to be performed when power generation for charging the storage device 104 is detected by the generation detecting circuit 102 while the AC magnetic-field detection pulses SP11 or the AC magnetic-field detection pulses SP12 are being output.

It is determined in step S2 that power generation for charging the storage device 104 has not been detected by the generation detecting circuit 102 while the high-frequency magnetic-field detection pulses SP0 are being output (step S2; No), it is determined whether power generation for charging the storage device 104 has been detected by the generation detecting circuit 102 while the AC magnetic-field detection pulses SP11 or the AC magnetic-field detection pulses SP12 are being output (step S3).

It is determined in step S3 that power generation for charging the storage device 104 has been detected by the generation detecting circuit 102 while the AC magnetic-field detection pulses SP11 or the AC magnetic-field detection pulses SP12 are being output (step S3; Yes), the duty down counter for lowering the duty ratio so as to reduce the effective power of the normal motor driving pulses K11 is reset (set to a predetermined initial duty-down-counter value), or counting down of the duty clown counter is discontinued (step S9).

Then, the output of the AC magnetic-field detection pulses SP11 and the AC magnetic-field detection pulses SP12 is discontinued (step S10).

Subsequently, the duty down counter for lowering the duty ratio so as to reduce the effective power of the normal motor driving pulses K11 is reset (set to a predetermined initial duty-down-counter value), or counting down of the duty down counter is discontinued (step S11). This processing is provided for the case in which a determination at step S4, which will be described below, is Yes, and since the processing has already been executed in step S9, it is not performed in step S11 in practice.

Then, the output of the normal driving motor pulses K11 is discontinued (or suspended) (step S12).

Subsequently, the duty down counter for lowering the duty ratio so as to reduce the effective power of the normal motor driving pulses K11 is reset (set to a predetermined initial duty-down-counter value), or counting down of the duty down counter is discontinued (step S13). This processing is provided for the case in which a determination at step S5, which will be described below, is Yes, and since the processing has already been executed in step S9, it is not performed in step S13 in practice.

The output of the rotation detection pulses SP2 is then discontinued (step S14).

Then, the correcting driving pulses P2+Pr are output (step S15). In this case, in actuality, the correcting driving pulses P2 drive the pulse motor 210, and the correcting driving pulses Pr are used by speedily shifting the pulse motor to a steady state by inhibiting vibrations after the rotor is rotated after driving the pulse motor.

Thereafter, in order to cancel a residual magnetic flux accompanied by an application of the correcting driving pulse P2+Pr, the demagnetizing pulses PE of the opposite polarity to the correcting driving pulses P2+Pr are output (step S16).

Upon completion of outputting the demagnetizing pulses PE, counting of the duty down counter is restarted (step S17), and the duty ratio of the normal driving pulses K11 is set so that power consumption can be minimized and the correcting driving pulses P2+Pr are not outputted.

The process then returns to step S1, and processing similar to the above-described processing is repeated.

Processing to be performed when power generation for charging the storage device 104 is detected by the generation detecting circuit 102 while the normal driving pulses K11 are being output.

If it is determined in step S3 that power generation for charging the storage device 104 by the generation detecting circuit 102 has not been detected while the AC magnetic-field detection pulses SP11 or the AC magnetic-field detection pulses SP12 are being output (step S3; No), it is determined whether power generation for charging the storage device 104 has been detected by the charging detection circuit 102 while the normal driving pulses K11 are being output (step S4).

If it is determined in step S4 that power generation for charging the storage device 104 has been detected by the generation detecting circuit 102 while the normal driving pulses K11 are being output (step S4; yes), the duty down counter for lowering the duty ratio so as to reduce the effective power of the normal motor-driving pulses K11 is reset (set to a predetermined initial duty-down counter value), or counting down of the duty down counter is discontinued (step S11).

Then, the output of the normal driving pulses K11 is discontinued (or suspended) (step S12).

Subsequently, the duty down counter for lowering the duty ratio so as to reduce the effective power of the normal motor-driving pulses K11 is reset (set to a predetermined initial duty-down counter value), or counting down of the duty down counter is discontinued (step S13). This processing is provided for the case in which a determination at step S5, which will be described below, is Yes, and since the processing has already been executed in step S11, it is not performed in step S13 in practice.

The output of the rotation detection pulses SP2 is discontinued (step S14).

Then, the correcting driving pulses P2+Pr are output (step S15).

Thereafter, in order to cancel a residual magnetic flux accompanied by an application of the correcting driving pulses P2+Pr, the demagnetizing pulses PE of the opposite polarity to the correcting driving pulses P2+Pr are output (step S16).

Upon completion of outputting the demagnetizing pulses PE, counting of the duty down counter is restarted (step S17), and the duty ratio of the normal driving pulses K11 is set so that power consumption can be minimized and the correcting pulses P2+Pr are not output.

The process then returns to step S1, and processing similar to the above-described processing is repeated.

Processing to be performed when power generation for charging the storage device 104 has been detected by the generation detecting circuit 102 while the rotation detection pulses SP2 are being output.

If it is determined in step S4 that power generation for charging the storage device 104 has not been detected by the generation detecting circuit 102 while the normal driving pulses K11 are being output (step S4; No), it is determined whether power generation for charging the storage device 104 has been detected by the generation detecting circuit 102 while the rotation detection pulses SP2 are being output (step S5).

If it is determined in step S5 that power generation for charging the storage device 104 has been detected by the generation detecting circuit 102 while the rotation detection pulses SP2 are being output (step S5; Yes), the duty down counter for lowering the duty ratio so as to reduce the effective power of the normal motor-driving pulses K11 is reset (set to a predetermined initial duty-down counter value), or counting down of the duty down counter is discontinued (step S13).

The output of the rotation detection pulses SP2 is discontinued (or suspended) (step S14).

Then, the correcting driving pulses P2+Pr are output (step S15).

Thereafter, in order to cancel a residual magnetic flux accompanied by an application of the correcting driving pulses P2+Pr are output (step S16).

Upon completion of outputting the demagnetizing pulses PE, counting of the duty down counter is restarted (step S17), and the duty ratio of the normal driving pulses K11 is set so that power consumption can be minimized and the correcting driving pulses P2+Pr are not output.

The process then returns to step S1, and processing similar to the above-described processing is repeated.

Processing to be performed when power generation for charging the storage device 104 has not been detected.

It is now assumed that power generation for charging the storage device 104 has not been detected while the high-frequency magnetic-field detection pulse signal SP0 is being output (step S2; No), power generation for charging the storage device 104 has not been detected while the AC magnetic-field detection pulses SP11 or the AC magnetic-field detection pulses SP12 are being output (step S3; No), power generation for charging the storage device 104 has not been detected while the normal driving pulses K11 are being output (step S4; No), and power generation for charging the storage device 104 has not been detected while the rotation detection pulses SP2 are being output (step S5; No). In this case, the duty ratio of the subsequent normal driving pulses K11 is reduced from that of the current normal driving pulses K11 if the conditions for reducing the duty ratio are met. On the other hand, if the duty ratio cannot be reduced further, i.e., if the duty ratio is the preset lowest duty ratio, the pulse width is controlled so that the current duty ratio is maintained (step S6).

Figure 25:
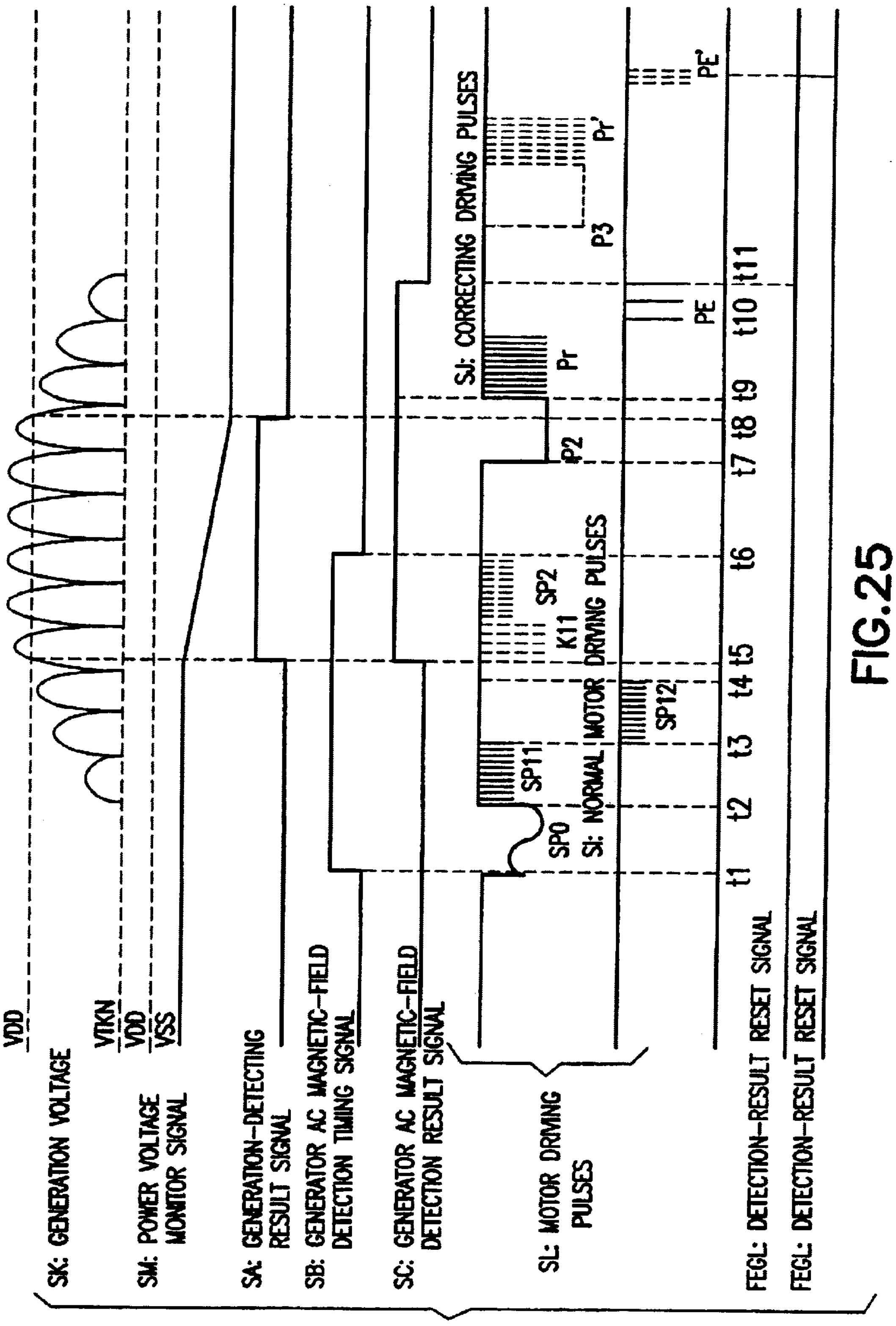
FIG. 25 is a timing chart of an embodiment of the invention.

An example of the specific operation of the first embodiment is described below with reference to the timing chart of FIG. 25.

At time t1, when the generator AC magnetic-field detection timing signal SB becomes on "H" level, the high-frequency magnetic-field detection pulses SP0 are output from the motor driving circuit to the pulse motor 210.

Then, at time t2, the AC magnetic-field detection pulses SP11 having a first polarity are output from the motor driving circuit to the pulse motor 210.

Thereafter, at time t3, the AC magnetic-field detection pulses SP12 having a second polarity opposite to the first polarity are output, and at time t4, the output of the normal motor-driving pulses K11 is started.

At time t5, however when the generation voltage of the generator portion 101 exceeds the high potential voltage VDD, the output voltage monitor signal SM (VSS) output from the step-up/down circuit 113 enters a non-steady state (or the absolute value thereof increases). Then, the generation-detecting result signal SA becomes an "H" level and the generator AC magnetic-field detection result signal SC becomes an "H" level, and the output of the normal motor-driving pulses K11 is thus discontinued (suspended). The output of the rotation detection pulses SP2 of the pulse motor 210 is also inhibited (discontinued).

Thereafter, at time t6, the generator AC magnetic-field detection timing signal SB becomes an "L" level, and at time 7, a predetermined time has elapsed after the output of the normal driving pulses K11 (corresponding to time t4) started. Then, the correcting driving pulses P2 having an effective power greater than that of the normal driving pulses K11 are output, thereby reliably driving the pulse motor 210.

Then, at time t8, when the generation voltage of the generator portion becomes below the high potential voltage VDD again, the output voltage monitor signal SM (VSS) output from the step-up/down circuit 113 enters a steady state (or the absolute value thereof decreases), and the generation-detecting result signal SA becomes an "L" level again.

At time 19, the correcting driving pulses Pr are output for speedily shifting the pulse motor to a steady state by inhibiting vibrations after the rotor is rotated after driving the pulse motor.

At time t10, in order to cancel a residual magnetic flux accompanied by an application of the correcting driving pulses P2+Pr, the demagnetizing pulses PE of the opposite polarity to the correcting driving pulses P2+Pr are output.

Time t10 is set to be immediately before a subsequent external magnetic field is detected (when the subsequent high-frequency magnetic-field detection pulses SP0 are output).

The pulse width of the demagnetizing pulses PE to be output is narrow (short) enough so as not to rotate the rotor, and a plurality of intermittent pulses (three pulses in FIG. 25) may desirably be provided to further enhance the demagnetizing effect.

At time t11, the output of the demagnetizing pulses PE is completed. Simultaneously, the detection-result reset signal FEGL becomes an "H" level so as to reset the detection results of the generator AC magnetic-field detection circuit 106, the high-frequency magnetic-field detection circuit 110, the AC magnetic-field detection circuit 111, and the rotation detection circuit 112, whereby the generator AC magnetic-field detection result signal SC becomes an "L" level.

As discussed above, unwanted power consumption can be prevented while reliably driving the pulse motor 210

Advantages of the tenth embodiment

According to the tenth embodiment, when conditions for reliably outputting the correcting driving pulses are met, that is, when power generation is detected by the generation detecting circuit 102 white the high-frequency magnetic-field detection pulses SPO, the AC magnetic-field detection pulses SP11 and SP12, the normal driving pulses K11, or the rotation detection pulses SP2 are being output, the output of the pulses is discontinued, and the output of the subsequent pulses is also inhibited. Thus, the rotation of the motor coil is reliably ensured by the correcting driving pulses. Accordingly, the need for outputting the various pulses SP0, SP11, SP12, K11, and SP2 is eliminated since the reliable rotation of the motor is ensured by the correcting driving pulses, and power required for outputting these pulses can thus be reduced.

Additionally, the generation detecting circuit 102 detects the presence or the absence of power generation for charging the storage device 104 via a path different from the charging path to the secondary cell. It is thus possible to simultaneously perform power generation detection and actual charging processing, and the charging efficiency is not lowered, which may otherwise be incurred upon detecting power generation.

Embodiment 11

The functional configuration of the control system of the eleventh embodiment is discussed below with reference to FIG. 23.

Figure 23:
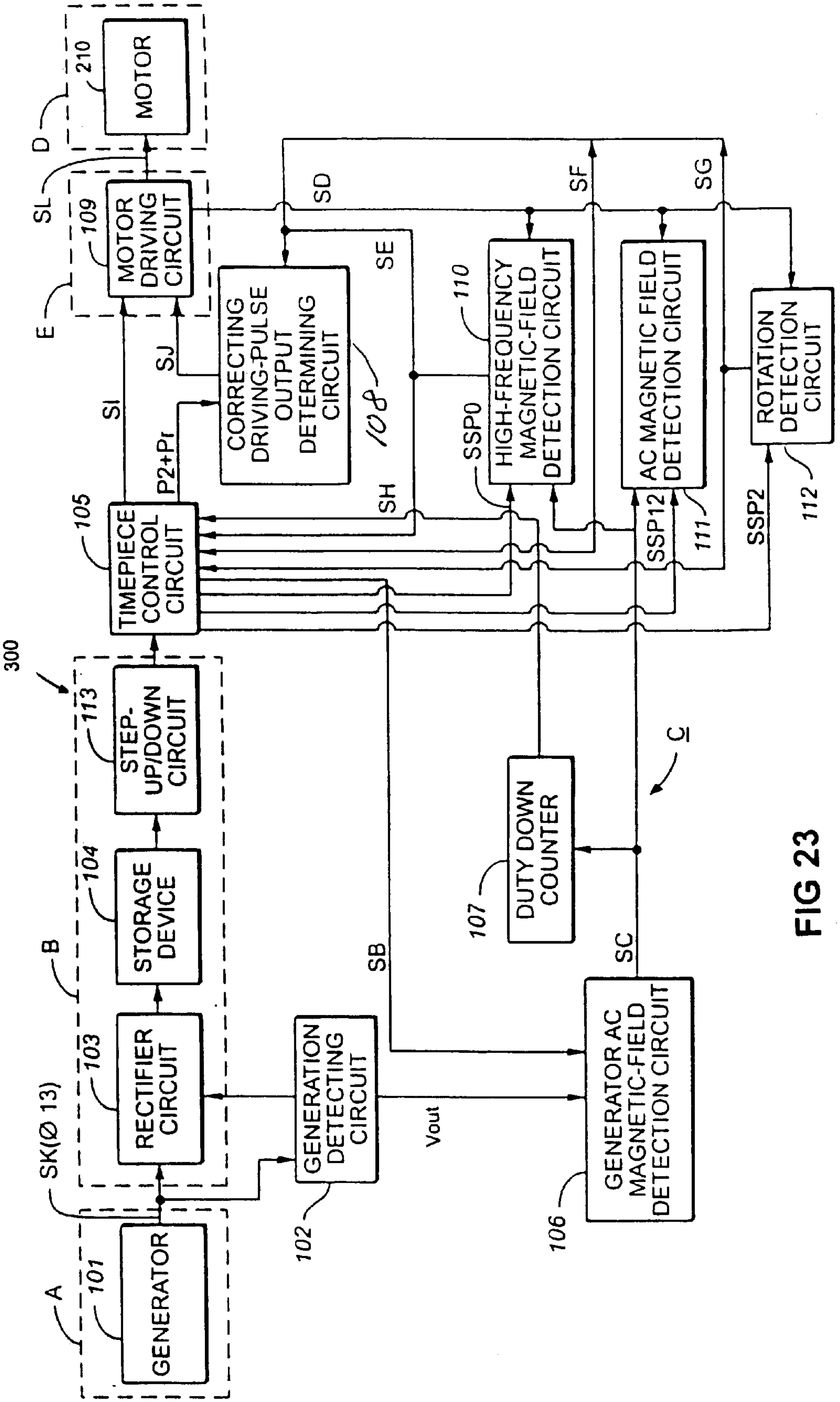
FIG. 23 is a block diagram illustrating the schematic functional configuration of a timepiece apparatus of an embodiment of the invention.

Symbols A through E in FIG. 23 correspond to the generator unit A, the power supply unit B, the control unit C, the hand-moving mechanism D, and the driving unit B, respectively, shown in FIG. 22.

A timepiece apparatus 300 is formed of: a generator portion 101 for generating AC power; a generation detecting circuit 102 for detecting power generation based on a generation voltage SK of the generator portion 101, and for outputting the generation-detecting result signal Vout; a rectifier circuit 103 for rectifying an alternating current output from the generator portion 101 and for converting it to a direct current; a storage device 104 for storing the direct current output from the rectifier circuit 103; a step-up/down circuit 113 for increasing or decreasing the stored voltage of the storage device 104 and outputting the voltage; a timepiece control circuit 105 which is operated by the increased stored voltage or the decreased stored voltage output from the step-up/down circuit 113, and which outputs the normal motor-driving pulses SI for performing timepiece control, the generator AC magnetic-field detection timing signal SB for designating the detection timing of a generator AC magnetic field, the high-frequency magnetic-field detection timing signed SSP0 indicating the output timing of the high-frequency magnetic-field detection pulse signal SP0, the AC magnetic-field detection timing signal SSP12, and the rotation-detection timing signal SSP2 indicating the output timing of the AC magnetic-field detection pulse signals SP11 and SP12, and the rotation detection pulse signal SP2; a generator AC magnetic-field detection circuit 106 for detecting a generator AC magnetic field based on the generation-detection result signal Vout and the generator AC magnetic-field detection timing signal SB, and for outputting the generator AC magnetic-field detection result signal SC; a duty down counter 107 for putting the normal-motor-driving-pulse duty down signal SH for controlling the duty down of the normal motor-driving pulses based on the generator AC magnetic-field detection result signal SC; a correcting-driving-pulse output circuit 108 for determining whether the correcting driving pulses SJ are to be output, based on the high-frequency magnetic-field detection result signal SE, the AC magnetic-field detection result signal SF, and the rotation-detection result signal SG, and for outputting the correcting driving pulses SJ if necessary; a motor driving circuit 109 for outputting the motor driving pulses SL for driving the pulse motor 210, based on the normal motor driving pulses SI or the correcting driving pulses SJ; a high-frequency magnetic-field detection circuit 110 for detecting a high-frequency magnetic field based on the generator AC magnetic-field detection result signal SC and the induction voltage signal SD output from the motor driving circuit 109, and for outputting the high-frequency magnetic-field detection result signal SE; an AC magnetic-field detection circuit 111 for detecting an AC magnetic field based on the generator AC magnetic-field detection result signal SC and the induction voltage generator SD output from the motor driving circuit 109, and for outputting the AC magnetic-field detection result signal SF; and a rotation detection circuit 112 for detecting whether the motor 210 is rotated based on the indication voltage signal SD output from the motor driving circuit 109, and for outputting the rotation-detection result signal SG.

Figure 20:
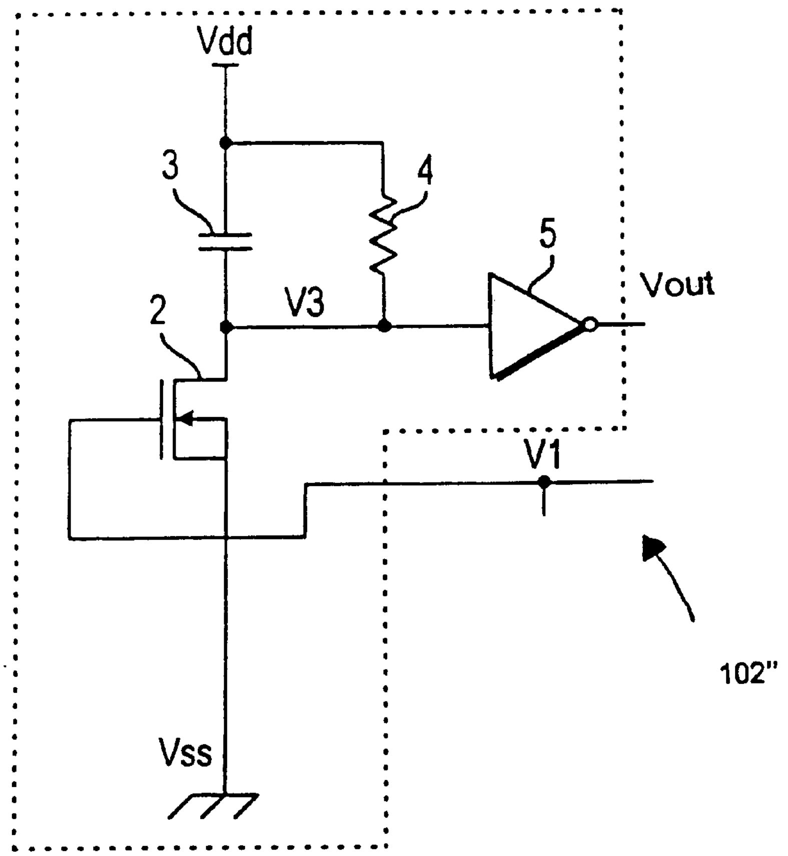
FIG. 20 is a circuit block diagram of an electronic device including a power-generation detection circuit similar to that shown in FIG. 1.
Figure 21:
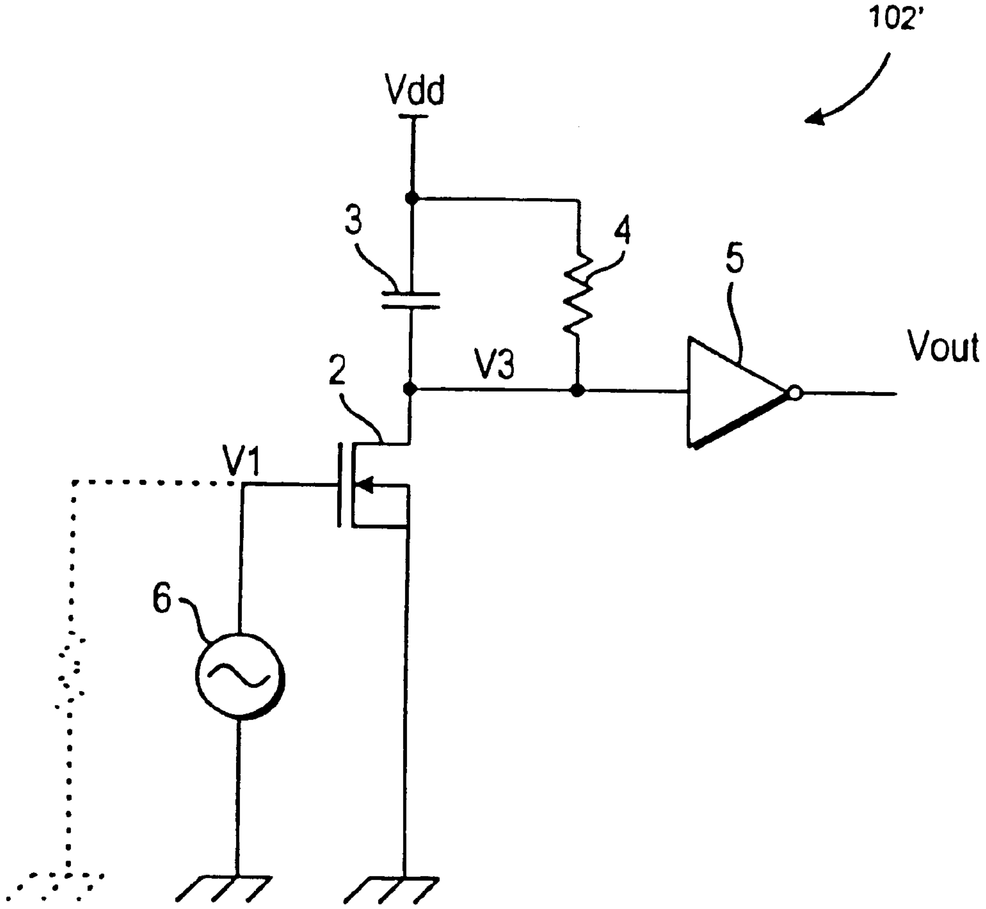
FIG. 21 is a circuit block diagram of a power-generation detection circuit similar to that shown in FIG. 2.

With further reference to FIG. 23, generation detecting circuit 102 may take the form of circuit 102', as shown in FIG. 20, or circuit 102", as shown in FIG. 21. Circuit 102' is similar to, and operates in a similar manner to, power generation detection circuit 1, as described above, and as shown in FIG. 1, circuit 102" is similar to, and operates in a similar manner to, power generation detection circuit 1, as described above, and as shown in FIG. 2.

What is claimed is:

1. A power-generation detection device comprising:

a power-generation detection circuit for detecting the generation of AC power from an external power-generation device, by outputting a power-generation detection signal, and a power-generation time detector for detecting that an output holding time of said power-generation detection signal continues for a predetermined period of time, said power-generation detection circuit comprising;

a switching element coupled to said power-generation device and performing a switching operation in response to a cycle of said externally generated AC power;

a capacitor element coupled to said switching element for storing charges in response to said switching operation of said switching element;

a discharging element coupled to said capacitor element, along a discharging path of said capacitor element, and discharging the charges stored in said capacitor element; and a voltage detector coupled to said capacitor element and the discharging element, detecting whether a voltage across said capacitor element exceeds a predetermined value and providing an output signal depending on the detected voltage.

2. A method of detecting power-generation and determining whether externally generated AC power is being generated from an external power-generation device, the method comprising:

charging a capacitor element in response to a cycle of the externally generated AC power;

discharging said capacitor element when charging of said capacitor element is not performed:

determining the voltage across said capacitor element;

monitoring the voltage across said capacitor element to determine whether the voltage exceeds a predetermined voltage, indicating that power generation is being performed; and detecting whether output holding time of said power-generation detection signal continues for a predetermined period of time.

* * * * *